(12) United States Patent
Pauletti et al.

(10) Patent No.: US 11,342,787 B2
(45) Date of Patent: May 24, 2022

(54) CONTROLLER CIRCUIT FOR PHOTOVOLTAIC MODULE

(71) Applicant: Texas Instruments Incorporated, Dallas, TX (US)

(72) Inventors: Timothy Patrick Pauletti, Dallas, TX (US); Suheng Chen, Plano, TX (US); Amneh Mohammed Akour, Plano, TX (US); Nat Maruthachalam Natarajan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 316 days.

(21) Appl. No.: 16/540,417

(22) Filed: Aug. 14, 2019

(65) Prior Publication Data
US 2020/0303949 A1    Sep. 24, 2020

Related U.S. Application Data

(60) Provisional application No. 62/821,050, filed on Mar. 20, 2019.

(51) Int. Cl.
*H02J 9/06* (2006.01)
*H02S 40/32* (2014.01)
*H02J 3/38* (2006.01)

(52) U.S. Cl.
CPC .............. *H02J 9/062* (2013.01); *H02J 3/383* (2013.01); *H02S 40/32* (2014.12); *H02J 3/388* (2020.01); *H02J 9/068* (2020.01)

(58) Field of Classification Search
CPC .. H02J 9/062; H02J 3/383; H02J 3/388; H02J 9/068; H02S 40/32
See application file for complete search history.

(56) References Cited

U.S. PATENT DOCUMENTS

| 7,884,278 | B2 | 2/2011 | Powell et al. |
| 8,013,472 | B2 | 9/2011 | Adest et al. |
| 8,035,249 | B2 | 10/2011 | Shaver, II et al. |

(Continued)

OTHER PUBLICATIONS

"SunSpec® Rapid Shutdown Transmit and Receive Reference Design" Texas Instruments, TI Designs: TIDA-060001, TIDUE68—May 2018, 39 pages.

(Continued)

*Primary Examiner* — Carlos Amaya
(74) *Attorney, Agent, or Firm* — Valerie M. Davis; Charles A. Brill; Frank D. Cimino

(57) ABSTRACT

A controller circuit for a PV module includes a receiver circuit and a mode control and power conversion circuit. The receiver circuit receives a first signal from a transmitter circuit associated with the PV module. The receiver circuit changes a second signal from a first state to a second state based the first signal. The mode control and power conversion circuit receives a DC string voltage from a string of PV cells associated with the PV module, receives the second signal from the receiver circuit, switches from a first mode to a second mode in response to the second signal being changed to the second state, converts the DC string voltage to a standby voltage in the second mode, and provides the standby voltage to DC power lines between the PV module and a DC-to-AC inverter in the second mode.

21 Claims, 15 Drawing Sheets

(56) References Cited

U.S. PATENT DOCUMENTS

| | | |
|---|---|---|
| 8,271,599 B2 | 9/2012 | Eizips et al. |
| 8,274,172 B2 | 9/2012 | Hadar et al. |
| 8,325,059 B2 | 12/2012 | Rozenboim |
| 8,427,009 B2 | 4/2013 | Shaver, II et al. |
| 8,531,005 B2 | 9/2013 | Whitfield et al. |
| 8,587,151 B2 | 11/2013 | Adest et al. |
| 8,653,689 B2 | 2/2014 | Rozenboim |
| 8,669,675 B2 | 3/2014 | Capp et al. |
| 8,816,535 B2 | 8/2014 | Adest et al. |
| 8,823,218 B2 | 9/2014 | Hadar et al. |
| 8,854,193 B2 | 10/2014 | Makhota et al. |
| 8,933,321 B2 | 1/2015 | Hadar et al. |
| 8,947,194 B2 | 2/2015 | Sella et al. |
| 9,007,210 B2 | 4/2015 | Avrutsky et al. |
| 9,112,379 B2 | 8/2015 | Sella et al. |
| 9,124,139 B2 | 9/2015 | Eizips et al. |
| 9,143,036 B2 | 9/2015 | Avrutsky |
| 9,184,794 B1 | 11/2015 | Ibrahim et al. |
| 9,184,967 B1 | 11/2015 | Ibrahim et al. |
| 9,235,228 B2 | 1/2016 | Gazit |
| 9,258,829 B1 | 2/2016 | Ibrahim et al. |
| 9,377,765 B2 | 6/2016 | Makhota et al. |
| 9,401,599 B2 | 6/2016 | Har-Shai et al. |
| 9,397,612 B2 | 7/2016 | Hadar et al. |
| 9,438,035 B2 | 9/2016 | Capp et al. |
| 9,590,526 B2 | 3/2017 | Adest et al. |
| 9,960,667 B2 | 5/2018 | Adest et al. |
| 2006/0162772 A1 | 7/2006 | Presher, Jr. |
| 2010/0207592 A1 | 8/2010 | Hester et al. |
| 2011/0140774 A1 | 6/2011 | Kaya et al. |
| 2012/0049816 A1 | 3/2012 | Hester |
| 2012/0049818 A1 | 3/2012 | Hester |
| 2012/0093198 A1 | 4/2012 | Dabak et al. |
| 2012/0126624 A1 | 5/2012 | Hester et al. |
| 2012/0139345 A1 | 6/2012 | Ye et al. |
| 2012/0152300 A1 | 6/2012 | Zuckerman |
| 2012/0314744 A1 | 12/2012 | Vedantham et al. |
| 2012/0320931 A1 | 12/2012 | Vedantham et al. |
| 2012/0320932 A1 | 12/2012 | Xu et al. |
| 2012/0320995 A1 | 12/2012 | Dabak et al. |
| 2012/0320996 A1 | 12/2012 | Dabak et al. |
| 2012/0324322 A1 | 12/2012 | Vedantham et al. |
| 2012/0327770 A1 | 12/2012 | Vijayasankar et al. |
| 2012/0327987 A1 | 12/2012 | Dabak et al. |
| 2013/0002044 A1 | 1/2013 | Takehara |
| 2013/0051268 A1 | 2/2013 | Nassar et al. |
| 2013/0051320 A1 | 2/2013 | Pande et al. |
| 2013/0051446 A1 | 2/2013 | Vijayasankar et al. |
| 2013/0051482 A1 | 2/2013 | Nassar et al. |
| 2013/0089124 A1 | 4/2013 | Kim et al. |
| 2013/0101055 A1 | 4/2013 | Pande et al. |
| 2013/0121425 A1 | 5/2013 | Pande et al. |
| 2013/0223457 A1 | 8/2013 | Pande et al. |
| 2013/0254615 A1 | 9/2013 | Vijayasankar et al. |
| 2013/0266081 A1 | 10/2013 | Pande et al. |
| 2013/0279515 A1 | 10/2013 | Vijayasankar et al. |
| 2013/0294531 A1 | 11/2013 | Vedantham et al. |
| 2013/0301649 A1 | 11/2013 | Vijayasankar et al. |
| 2013/0322554 A1 | 12/2013 | Vijayasankar et al. |
| 2013/0343403 A1 | 12/2013 | Vijayasankar et al. |
| 2013/0343404 A1 | 12/2013 | Vijayasankar et al. |
| 2014/0105313 A1 | 5/2014 | Kim et al. |
| 2014/0146900 A1 | 5/2014 | Dabak et al. |
| 2014/0229748 A1 | 8/2014 | Li et al. |
| 2015/0043596 A1 | 2/2015 | Lin et al. |
| 2015/0071077 A1 | 3/2015 | Vijayasankar et al. |
| 2015/0071306 A1 | 3/2015 | Lin et al. |
| 2015/0071364 A1 | 3/2015 | Batra et al. |
| 2015/0098569 A1 | 4/2015 | Vijayasankar et al. |
| 2015/0180539 A1 | 6/2015 | Vedantham et al. |
| 2015/0180680 A1 | 6/2015 | Vijayasankar et al. |
| 2015/0236753 A1 | 8/2015 | Pande et al. |
| 2015/0341084 A1 | 11/2015 | Kim et al. |
| 2015/0349844 A1 | 12/2015 | Vijayasankar et al. |
| 2015/0381355 A1 | 12/2015 | Vijayasankar et al. |
| 2016/0043773 A1 | 2/2016 | Pande et al. |
| 2016/0050045 A1 | 2/2016 | Vijayasankar et al. |
| 2016/0079761 A1 | 3/2016 | Pilawa-Podgurski et al. |
| 2016/0094373 A1 | 3/2016 | Ibrahim et al. |
| 2016/0112548 A1 | 4/2016 | Dabak et al. |
| 2016/0119028 A1 | 4/2016 | Vijayasankar et al. |
| 2016/0127056 A1 | 5/2016 | Soman et al. |
| 2016/0233923 A1 | 8/2016 | Vedantham et al. |
| 2016/0323132 A1 | 11/2016 | Ibrahim et al. |
| 2016/0330213 A1 | 11/2016 | Vijayasankar et al. |
| 2016/0344450 A1 | 11/2016 | Pande et al. |
| 2017/0093279 A1 | 3/2017 | Hezar et al. |
| 2017/0195228 A1 | 7/2017 | Vijayasankar et al. |
| 2017/0288408 A1* | 10/2017 | Kim .................. H02S 40/34 |
| 2017/0317803 A1 | 11/2017 | Lin et al. |
| 2017/0366230 A1 | 12/2017 | Pande et al. |
| 2018/0219480 A1 | 8/2018 | Hezar et al. |
| 2018/0234526 A1 | 8/2018 | Xu et al. |
| 2018/0294840 A1 | 10/2018 | Vijayasankar et al. |
| 2019/0052313 A1 | 2/2019 | Kim et al. |
| 2019/0140693 A1 | 5/2019 | Kim et al. |
| 2019/0173643 A1 | 6/2019 | Lin et al. |

OTHER PUBLICATIONS

"Communication Signal for Rapid Shutdown SunSpec Interoperability Specification" SunSpec Alliance, Approved, Version 34, Aug. 21, 2017, 25 pages.

"Communication Signal for Rapid Shutdown SunSpec Interoperability Specification" SunSpec Alliance, Test, Version 28, Oct. 28, 2016, 24 pages.

D. Shmilovitz, "On the control of photovoltaic maximum power point tracker via output parameters" IEEE Proc.-Electr. Power Appl., vol. 152, No. 2, Mar. 2005, pp. 239-248.

Robert C.N. Pilawa-Podgurski et al., "Submodule Integrated Distributed Maximum Power Point Tracking for Solar Photovoltaic Applications" IEEE Transactions on Power Electronics, vol. 28, No. 6, Jun. 2013, pp. 2957-2967.

Qin et al.., "A Distributed Approach to Maximum Power Point Tracking for Photovoltaic Submodule Differential Power Processing" IEEE Transactions on Power Electronics, vol. 30, No. 4, Apr. 2015, pp. 2024-2040.

Shenoy et al., "Differential Power Processing for Increased Energy Production and Reliability of Photovoltaic Systems" IEEE Transactions on Power Electronics, vol. 28, No. 6, Jun. 2013, pp. 2968-2979.

Robert C.N. Pilawa-Podgurski et al., "Integrated CMOS Energy Harvesting Converter With Digital Maximum Power Point Tracking for a Portable Thermophotovoltaic Power Generator" IEEE Journal of Emerging and Selected Topics in Power Electronics, vol. 3, No. 4, Jun. 2015, pp. 1021-1035.

Pilawa-Podgurski, R.C.N et al. "Low-power Maximum Power Point Tracker with Digital Control for Thermophotovoltaic Generators." Applied Power Electronics Conference and Exposition (APEC), 2010 Twenty-Fifth Annual IEEE. 2010. 961-967. Copyright © 2010, IEEE, pp. 961-967.

R.C.N. Pilawa-Podgurski, W. Li, I. Celanovic, D.J. Perreault "Integrated CMOS DC-DC Converter with Digital Maximum Power Point Tracking for a Portable Thermophotovoltaic Power Generator," IEEE Energy Conversion Congress and Exposition, 2011, pp. 197-204.

Intertek, Standard Update Notice (SUN), Issued: Aug. 14, 2018, 7 pgs.

Maxim Integrated, "Enable Flexible PV System Design with Cell-String Optimizers", Aug. 29, 2016, 9 pages.

Rick Ivins, "2014 NEC 690.12 Rapid Shutdown For String Inverters On Flat Roofs", Aug. 16, 2016, https://www.purepower.com/blog/NEC-690-12-rapid-shutdown-of-pv-systems-on-buildings/, downloaded May 22, 2019, 5 pages.

Rick Ivins, "2017 NEC 690.12 Rapid Shutdown—Important Changes", https://www.purepower.com/blog/2017-nec-690.12-rapid-shutdown-important-changes/, downloaded May 22, 2019, 5 pages.

(56) References Cited

OTHER PUBLICATIONS

"SmartPSB2000L Smart PV Safety Box Quick Guide", Issue: 05, Part No. 31509508, Date: Aug. 22, 2018, Huawei Technologies Col, Ltd., 12 pages.

Solar Edge Safety Functions Firefighting, "Firefighting & PV Systems—Risks and Solutions", https://www.solaredge.com/sites/default/files/firefighting_and_pv_systems_risks_and_solutions_eng.pdf, downloaded May 22, 2019, 26 pages.

Texas Instruments, "Solar Power Optimizer", http://www.ti.com/solution/solar_micro_converter_dc_dc_power_optimizer/, downloaded May 22, 2019, 2 pages.

Tigo® Flex MLPE, "Smart Module Platform", TS4, PV Module Integrated Platform, PV 2.0, Tigo Energy Inc., Sep. 10, 2018, 4 pages.

PCT Search Report dated Jun. 25, 2020.

\* cited by examiner

CONTROLLER CIRCUIT FOR PHOTOVOLTAIC MODULE

Under 35 U.S.C. § 119, this application claims priority to, and the benefit of, U.S. Provisional Patent Application Ser. No. 62/821,050, entitled "Integrated, Low Cost, Rapid Shutdown Solution for Photovoltaic Systems," filed Mar. 20, 2019, the entirety of which is hereby incorporated by reference.

BACKGROUND

The National Electrical Code (NEC) applies to the construction of photovoltaic (PV) systems installed on buildings. The 2014 version (2014 NEC) includes a requirement for rapid shutdown of controlled conductors outside the PV array boundary. The 2017 version (2017 NEC) includes a requirement for module-level shutdown.

Underwriters Laboratory (UL) 1741 includes requirements for PV rapid shutdown equipment (PVRSE) and PV rapid shutdown systems (PVRSSs). To meet the requirements of the 2017 NEC and UL 1741, it is advantageous for modules, inverters, charge controllers, and other equipment to communicate with each other. Furthermore, it is desirable to have a single communication protocol to provide interoperability between the different components from different manufacturers that are required to participate in a PVRSS.

For example, SunSpec Interoperability Specification, Communication Signal for Rapid Shutdown, Version 34, Aug. 21, 2017, defines how to propagate the operational state of the entire PV system to the individual power production components comprising the PV system. The SunSpec Specification also describes requirements and constraints associated with power line communication (PLC) networks that are used to support a PVRSS. A PVRSS is a collection of components and communication protocols that are used to fulfill rapid shutdown requirements as defined by NEC 2014 or NEC 2017. Components of a rapid shutdown communication system are initiator(s), transmitter(s), and receiver(s). The SunSpec Specification supports rapid shutdown requirements of any PV system governed by NEC 2014, NEC 2017, or applicable UL standard(s), irrespective of system configuration.

SUMMARY

An example of a controller circuit for a PV module includes a receiver circuit and a mode control and power conversion circuit. The receiver circuit receives a first signal from a transmitter circuit associated with the PV module. The receiver circuit changes a second signal from a first state to a second state based on the first signal. The mode control and power conversion circuit receives a DC string voltage from a string of PV cells associated with the PV module. The mode control and power conversion circuit also receives the second signal from the receiver circuit. The mode control and power conversion circuit switches from a first mode to a second mode in response to the second signal being changed to the second state. The mode control and power conversion circuit converts the DC string voltage to a standby voltage in the second mode. The mode control and power conversion circuit provides the standby voltage to DC power lines between the PV module and a DC-to-AC inverter in the second mode.

An example of a method for rapid shutdown of a PV module includes receiving a first signal at a receiver circuit of a controller circuit for the PV module from a transmitter circuit associated with the PV module. The receiver circuit changes a second signal from a first state to a second state based on the first signal. A mode control and power conversion circuit of the controller circuit receives a DC string voltage from a string of PV cells associated with the PV module. The mode control and power conversion circuit receives the second signal from the receiver circuit. The mode control and power conversion circuit switches from a first mode to a second mode in response to the second signal being changed to the second state. The mode control and power conversion circuit converts the DC string voltage to a standby voltage in the second mode. The mode control and power conversion circuit provides the standby voltage to DC power lines between the PV module and a DC-to-AC inverter in the second mode.

An example of a system for rapid shutdown of a PV module includes an initiation device, a transmitter circuit, and a controller circuit. The initiation device switches between a first condition and a second condition. The first condition sets a fourth signal to a first state to enable operation of the system in a first mode. The second condition changes the fourth signal to a second state to trigger operation of the system in a second mode. The transmitter circuit receives the fourth signal from the initiation device. The transmitter circuit generates a first signal in response to the fourth signal. The controller circuit includes a receiver circuit and a mode control and power conversion circuit. The receiver circuit receives the first signal from the transmitter circuit. The receiver circuit changes a second signal from a first state to a second state based the first signal. The mode control and power conversion circuit receives a DC string voltage from a string of PV cells associated with a PV sub-module of the PV module. The mode control and power conversion circuit also receives the second signal from the receiver circuit. The mode control and power conversion circuit switches from the first mode to a second mode in response to the second signal being changed to the second state. The mode control and power conversion circuit converts the DC string voltage to a standby voltage in the second mode. The mode control and power conversion circuit provides the standby voltage to DC power lines between the PV module and a DC-to-AC inverter in the second mode.

DETAILED DESCRIPTION

Figure 1:
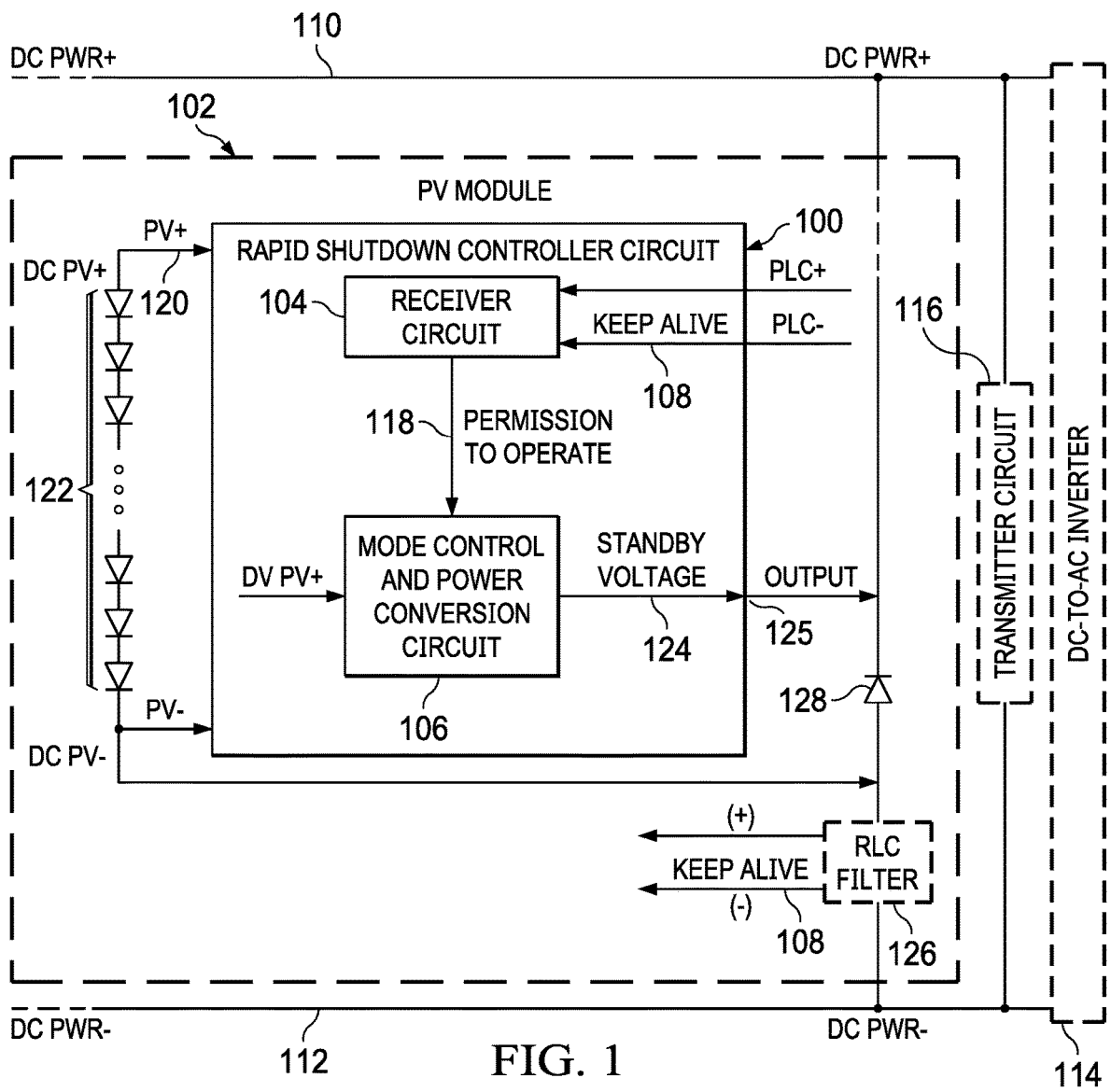
FIG. 1 is a block diagram of an example of a controller circuit for a PV module.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner like the term "comprising", and thus should be interpreted to mean "including, but not limited to . . . ."

FIG. 1 shows an example of a controller circuit 100 for a PV module 102. The controller circuit 100 includes a receiver circuit 104 and a mode control and power conversion circuit 106. For example, FIG. 1 refers to the controller circuit 100 as a rapid shutdown controller circuit. The receiver circuit 104 receives a first signal 108 from a transmitter circuit 116 associated with the PV module 102. For example, FIG. 1 refers to the first signal 108 as a keep alive (KA) signal. The KA signal may be transmitted one or more times within a frame. The frame may be transmitted periodically or asynchronously within a first predetermined time period. In another example, the first signal 108 may be a shutdown signal. The shutdown signal may be transmitted asynchronously in response to a shutdown event. The shutdown signal may be transmitted multiple times to ensure detection. The receiver circuit 104 changes a second signal 118 from a first state to a second state based on the first signal 108. For example, FIG. 1 refers to the second signal 118 as a permission to operate (PTO) signal. The first state of the second signal 118, for example, is an activation state, an ON state, a logic 1 state, or any suitable state representative of enabling normal operation of the controller circuit 100. The second state of the second signal 118, for example, is a de-activation state, an OFF state, a logic 0 state, or any suitable state representative of disabling normal operation of the controller circuit 100.

The mode control and power conversion circuit 106 receives a DC string voltage 120 from a string of PV cells 122 associated with the PV module 102. The mode control and power conversion circuit 106 also receives the second signal 118 from the receiver circuit 104. The mode control and power conversion circuit 106 switches from a first mode (e.g., normal mode) to a second mode (e.g., shutdown mode) in response to the second signal 118 being changed to the second state. The mode control and power conversion circuit 106 converts the DC string voltage 120 to a standby voltage 124 in the second mode. The mode control and power conversion circuit 106 provides the standby voltage 124 via an output node 125 to DC power lines 110, 112 between the PV module 102 and a DC-to-AC inverter 114 in the second mode.

In one example of the PV module 102, the DC power lines 110, 112 carry the first signal 108 to an RLC filter 126 or any suitable filter that provides a filtered version of the first signal 108 to the receiver circuit 104. In another example of the PV module 102, the first signal 108 is a wireless communication signal (e.g., WiFi, Zigbee, or any suitable wireless signal) and the receiver circuit 104 includes a wireless receiver to receive the first signal 108 from the transmitter circuit 116. In another example of the PV module 102, the first signal 108 is a wired control line communication signal (e.g., wires, cable, bus, or any conductor(s) suitable for wired control signals) and the receiver circuit 104 includes an input node to receive the first signal 108 from the transmitter circuit 116. In one example, a Schottky diode 128 or any suitable bypass diode is connected from an output node 125 of the controller circuit 100 to the RLC filter 126 or the DC power line return 112. The Schottky diode 128 passes DC current in a condition in which no voltage is output by the controller circuit 100.

In another example of the controller circuit 100, the PV module 102 includes the controller circuit 100. In another example, the controller circuit 100 is an IC. In another example of the controller circuit 100, the standby voltage 124 is 2.5 volts DC or less. In yet another example of the controller circuit 100, the standby voltage 124 is 1 volt DC or less. In other examples, the standby voltage 124 is any suitable DC voltage that is safe for maintenance technicians, service personnel, inspectors, and/or emergency first responders.

In another example of the controller circuit 100, the standby voltage 124 on the DC power lines 110, 112 provides power to the transmitter circuit 116 during the second mode. In another example of the controller circuit 100, the standby voltage 124 on the DC power lines 110, 112 provides power to the DC-to-AC inverter 114 during the second mode.

In another example of the controller circuit 100, the second mode and the standby voltage 124 on the DC power lines 110, 112 are in compliance with the safety standards for rapid shutdown of PV systems in NEC 2014, NEC 2017, and SunSpec Interoperability Specification, Communication Signal for Rapid Shutdown, Version 34.

In another example of the controller circuit 100, the first signal 108 is repeatedly transmitted by the transmitter circuit 116 to enable normal operation of the PV module 102. The receiver circuit 104 sets the second signal 118 to the first state based on a presence of the first signal 108. The receiver circuit 104 changes the second signal 118 to the second state based on an absence of the first signal 108. In one example, presence of the first signal 108 is repeatedly detected by the receiver circuit 104 after filtering and demodulating communication signals from the DC power lines 110, 112. For example, if at least one first signal 108 is detected over a second predetermined time period, the receiver circuit 104 considers the first signal 108 to be present. Conversely, if no first signal 108 is detected over the second predetermined time period, the receiver circuit 104 considers the first signal 108 to be absent. The second predetermined time period, for example, being less than or equal to the first predetermined time period associated with the repeated transmission of the first signal 108.

In another example of the controller circuit 100, the first signal 108 is transmitted at least once by the transmitter circuit 116 to disable normal operation of the PV module 102. The receiver circuit 104 sets the second signal 118 to the first state based on an absence of the first signal 108. The receiver circuit 104 changes the second signal 118 to the second state based on a presence of the first signal 108. In this example, the receiver circuit 104 processes the shutdown signal differently than the KA signal such that the second signal 118 is used in the same manner even though the logic for processing the shutdown and KA signals is different. In other words, the second signal 118 operates as a PTO signal regardless of whether the first signal 108 is the shutdown signal or the KA signal.

In another example, if at least one first signal 108 is detected, the receiver circuit 104 considers the first signal 108 to be present. In order to ensure detection, the transmitter circuit 116 may re-transmit the first signal 108 multiple times during a first predetermined time. Conversely, if no first signal 108 is detected during a second predetermined time, the receiver circuit 104 considers the first signal 108 to be absent.

In another example of the controller circuit 100, the first signal 108 is a power line communication (PLC) signal. In this example, the receiver circuit 104 receives the PLC signal via the DC power lines 110, 112 between the PV module 102 and the DC-to-AC inverter 114. In a further example of the controller circuit 100, the transmitter circuit 116 transmits the first signal 108 over the DC power lines 110, 112 in a spread frequency-shift keying (S-FSK) waveform that is in compliance with the PLC protocol requirements of SunSpec Interoperability Specification, Communication Signal for Rapid Shutdown, Version 34. In another example of the controller circuit 100, the first signal 108 is a wireless communication signal. In another example of the controller circuit 100, the first signal 108 is a wired control line communication signal.

In another example of the controller circuit 100, the second signal 118 is a digital signal with digital logic levels that represent activation of the first mode in the first state and de-activation of the first mode in the second state. In another example of the controller circuit 100, the DC-to-AC inverter 114 includes the transmitter circuit 116.

Figure 2:
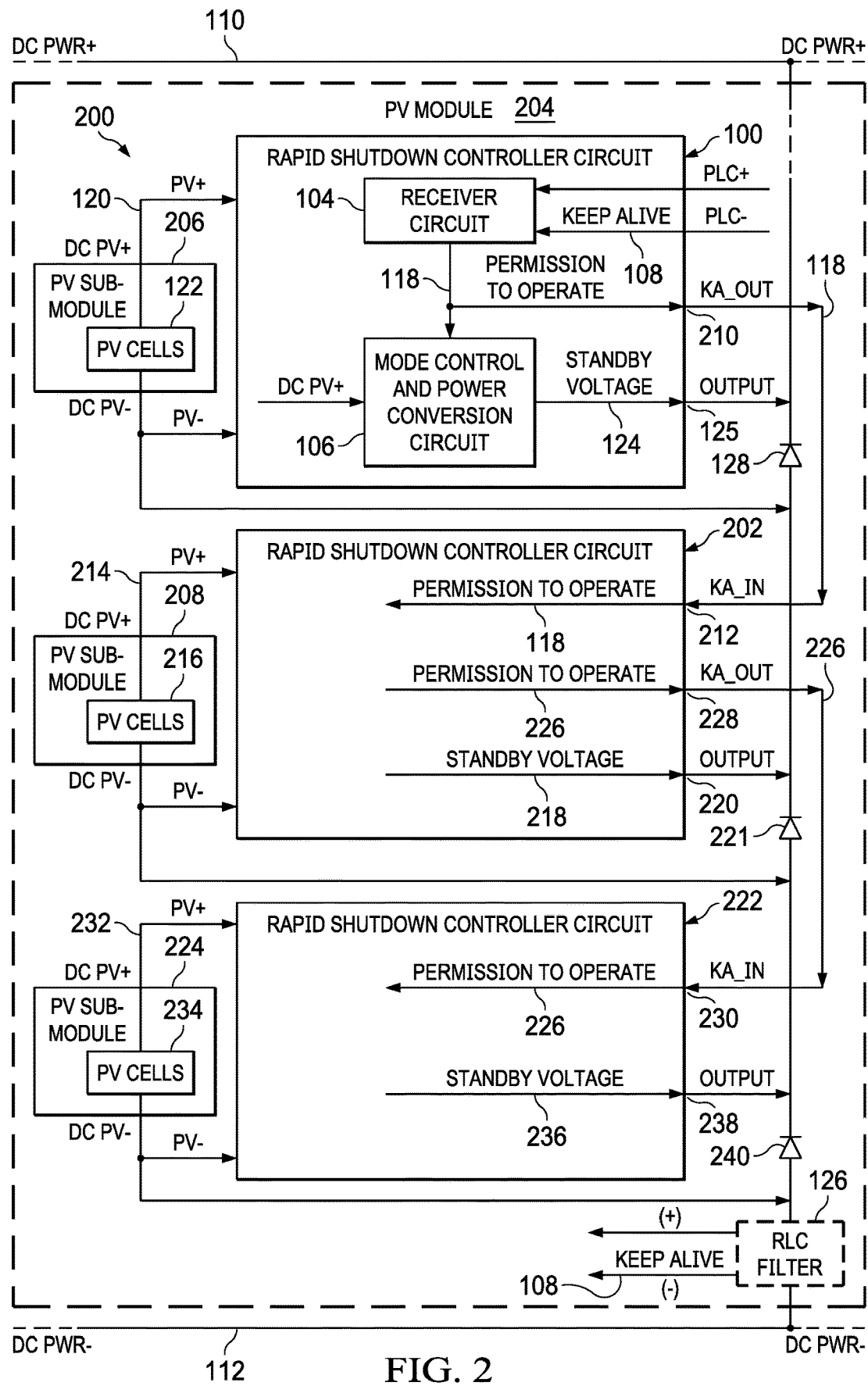
FIG. 2 is a block diagram of an example of multiple controller circuits for a PV module.

With reference to FIG. 2, an example of a controller subsystem 200 includes the controller circuit 100 and a second controller circuit 202. For example, FIG. 2 refers to the second controller circuit 202 as a rapid shutdown controller circuit. An example of a PV module 204 includes a first PV sub-module 206 and a second PV sub-module 208. The first PV sub-module 206 includes the string of PV cells 122. In another example, the first PV sub-module 206 also includes the controller circuit 100. The controller circuit 100 receives the DC string voltage 120 from the first PV sub-module 206 of the PV module 204. The controller circuit 100 includes the receiver circuit 104 and the mode control and power conversion circuit 106. The receiver circuit 104 operates in the same manner as described above with reference to FIG. 1. Likewise, the mode control and power conversion circuit 106 operates in the same manner as described above with reference to FIG. 1.

The receiver circuit 104 receives the first signal 108 from the RLC filter 126. For example, FIG. 2 refers to the first signal 108 as the KA signal. In another example the first signal 108 may be a shutdown signal. The receiver circuit 104 provides the second signal 118 via a KA_OUT node 210 to the second controller circuit 202 at a KA_IN node 212. The second controller circuit 202 receives a second DC string voltage 214 from a second string of PV cells 216 associated with the second PV sub-module 208 of the PV module 204. For example, FIG. 2 shows the second PV sub-module 208 including the second string of PV cells 216. In another example, the second PV sub-module 208 also includes the second controller circuit 202. The second controller circuit 202 switches from the first mode to the second mode in response to the second signal 118 being changed to the second state. The second controller circuit 202 converts the second DC string voltage 214 to a second standby voltage 218 in the second mode. The second controller circuit 202 provides the second standby voltage 218 via a second output node 220 to the DC power lines 110, 112 in the second mode such that the second standby voltage 218 is in series with the standby voltage 124.

In one example of the PV module 204, the first signal 108 is a PLC signal and the RLC filter 126 or any suitable filter provides the first signal 108 to the receiver circuit 104 by filtering the DC power lines 110, 112. In another example of the PV module 204, the first signal 108 is a wireless communication signal and the receiver circuit 104 includes a wireless receiver to receive the first signal 108 from the transmitter circuit 116 (see FIG. 1). In another example of the PV module 204, the first signal 108 is a wired control line communication signal and the receiver circuit 104 includes an input node to receive the first signal 108 from the transmitter circuit 116 (see FIG. 1). In another example, a Schottky diode 221 or any suitable bypass diode is connected from the second output node 220 of the second controller circuit 202 to the RLC filter 126 or the DC power line return 112. The Schottky diode 221 passes DC current in a condition in which no voltage is output by the second controller circuit 202.

In a further example of the controller subsystem 200, a sum of the standby voltage 124 and second standby voltage 218 is 2.5 volts DC or less. In another further example of the controller subsystem 200, the sum of the standby voltage 124 and second standby voltage 218 is 1 volt DC or less. In other examples, the sum of the standby voltage 124 and second standby voltage 218 is any suitable DC voltage that is safe for maintenance technicians, service personnel, inspectors, and/or emergency first responders.

In another example, the controller subsystem 200 also includes a third controller circuit 222. For example, FIG. 2 refers to the third controller circuit 222 as a rapid shutdown controller circuit. Another example of the PV module 204 also includes a third PV sub-module 224. The third PV sub-module 224 includes a third string of PV cells 234. In another example, the third PV sub-module 224 also includes the third controller circuit 222. The second controller circuit 202 changes a third signal 226 from a first state to a second state in response to the second signal 118 being changed to the second state by the receiver circuit 104. For example, FIG. 2 refers to the third signal 226 as a PTO signal. The second controller circuit 202 provides the third signal 226 via a second KA_OUT node 228 to the third controller circuit 222 at a second KA_IN node 230. The second controller circuit 202 sets the third signal 226 to a first state in response to the second signal 118 being set to the first state by the receiver circuit 104. The first state of the third signal 226, for example, is an activation state, an ON state, a logic 1 state, or any suitable state representative of enabling normal operation of the second and third controller circuits 202, 222. The second state of the third signal 226, for example, is a de-activation state, an OFF state, a logic 0 state, or any suitable state representative of disabling normal operation of the second and third controller circuits 202, 222.

The third controller circuit 222 receives a third DC string voltage 232 from the third string of PV cells 234. The third controller circuit 222 switches from the first mode to the second mode in response to the third signal 226 being changed to the second state. The third controller circuit 222 converts the third DC string voltage 232 to a third standby voltage 236 in the second mode. The third controller circuit 222 provides the third standby voltage 236 via a third output node 238 to the DC power lines 110, 112 in the second mode such that the third standby voltage 236 is in series with the standby voltage 124 and the second standby voltage 218.

In one example, a Schottky diode 240 or any suitable bypass diode is connected from the third output node 238 of the third controller circuit 222 to the RLC filter 126 or the DC power line return 112. The Schottky diode 240 passes DC current in a condition in which no voltage is output by the third controller circuit 222.

In a further example of the controller subsystem 200, a sum of the standby voltage 124, second standby voltage 218, and third standby voltage 236 is 2.5 volts DC or less. In another further example of the controller subsystem 200, the sum of the standby voltage 124, second standby voltage 218, and third standby voltage 236 is 1 volt DC or less. In other examples, the sum of the standby voltage 124, second standby voltage 218, and third standby voltage 236 is any suitable DC voltage that is safe for maintenance technicians, service personnel, inspectors, and/or emergency first responders.

Figure 3:
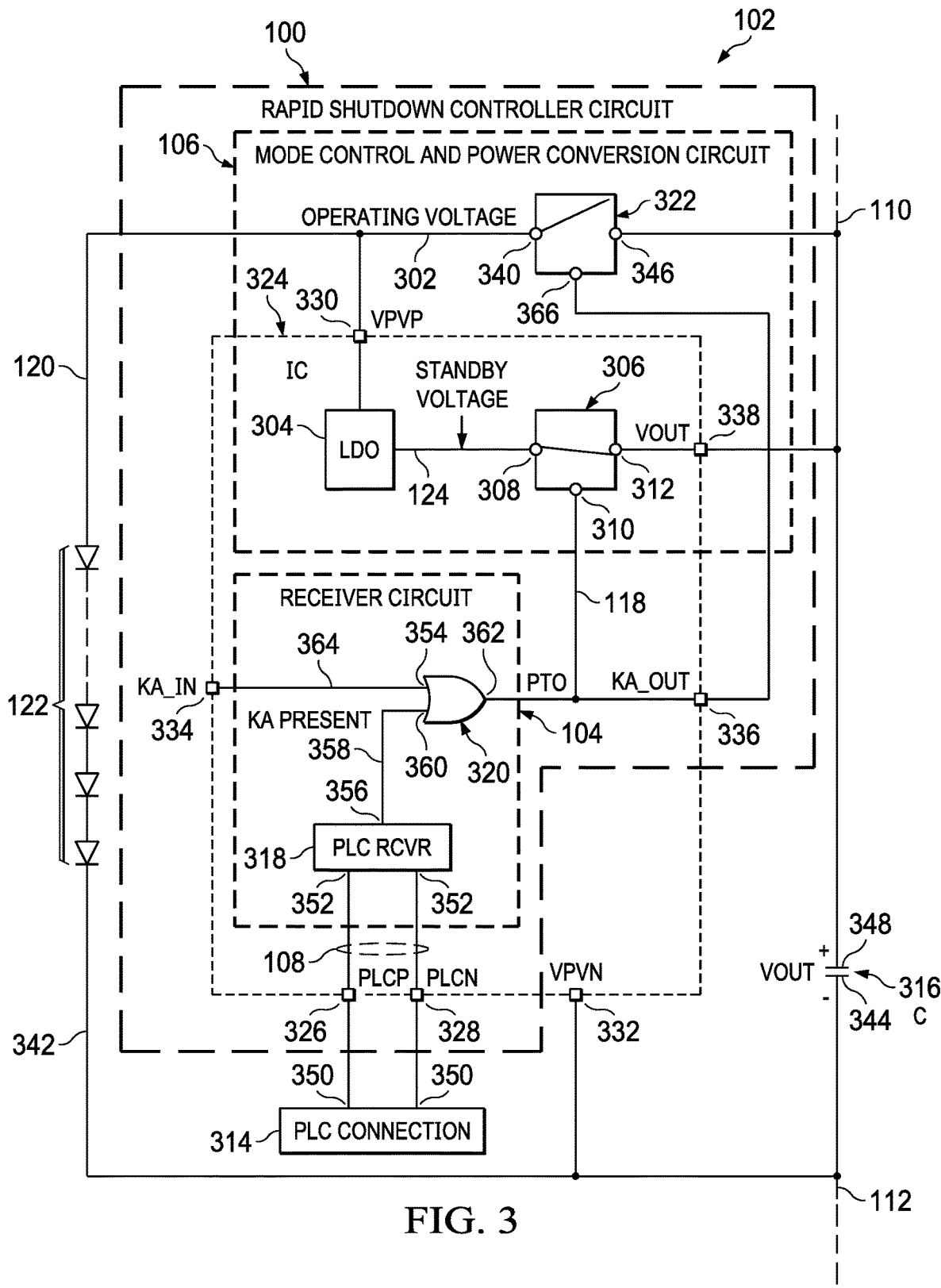
FIG. 3 is a block diagram of another example of a controller circuit for a PV module.

With reference to FIG. 3, in another example of the controller circuit 100, the mode control and power conversion circuit 106 provides an operating voltage 302 based on the DC string voltage 120 to the DC power lines 110, 112 in the first mode. The standby voltage 124 is less than the operating voltage 302. The mode control and power conversion circuit 106 decouples the operating voltage 302 from the DC power lines 110, 112 in the second mode.

In another example of the controller circuit 100, the mode control and power conversion circuit 106 includes a regulator circuit (e.g., low dropout (LDO) regulator) 304 and a switching device (S1) 306. The regulator circuit 304 receives the DC string voltage 120 and converts the DC string voltage 120 to the standby voltage 124. The switching device 306 receives the standby voltage 124 from the regulator circuit 304 at an input terminal 308, receives the second signal 118 from the receiver circuit 104 at a control terminal 310, and provides the standby voltage 124 to the DC power lines 110,112 via an output terminal 312 in response to the second signal 118 being changed to the second state. The switching device 306 decouples the standby voltage 124 from the output terminal 312 in response to the second signal 118 being set to the first state.

Figure 5:
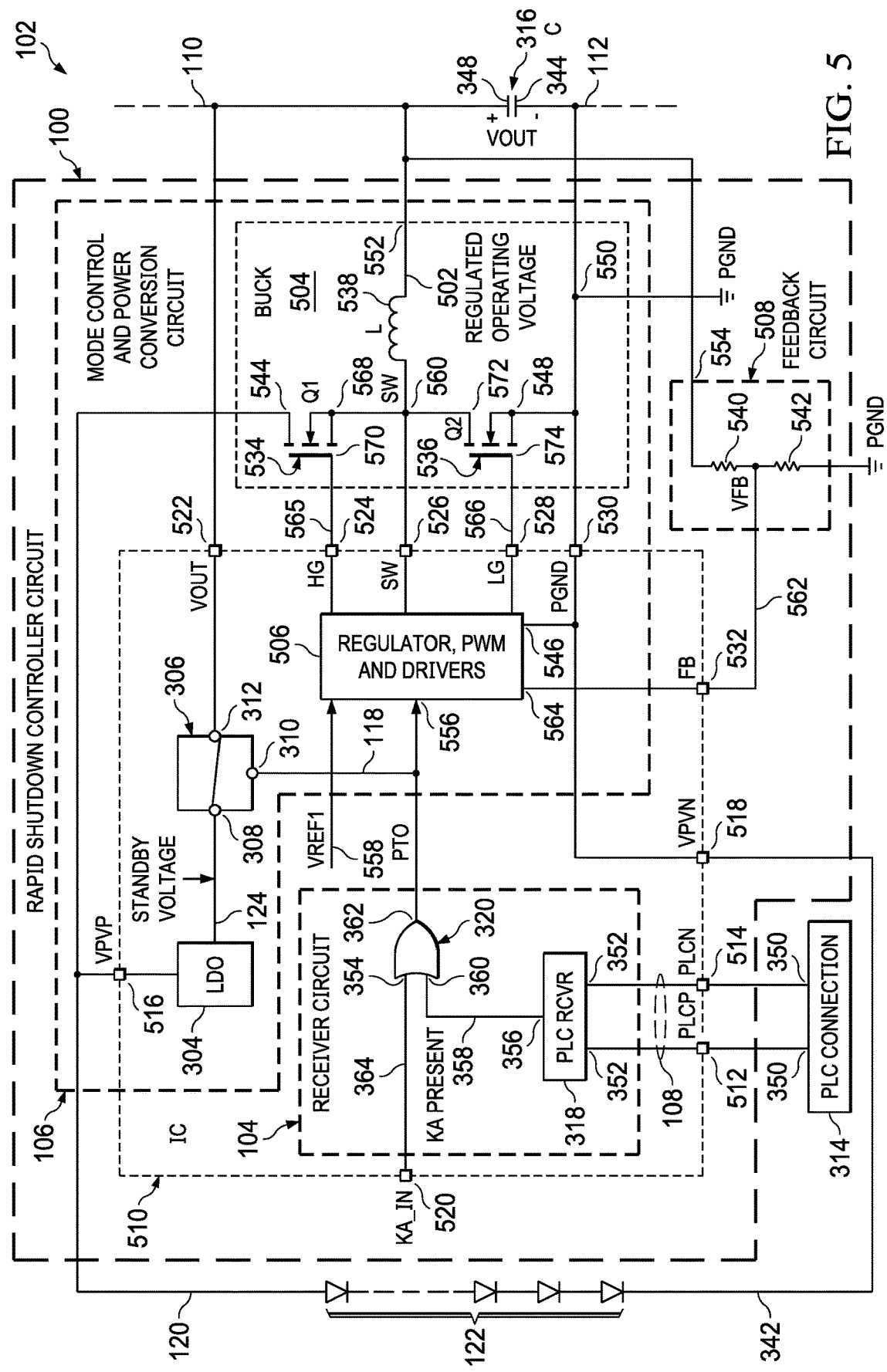
FIG. 5 is a block diagram of another example of a controller circuit for a PV module.

With reference to FIG. 5, in another example of the controller circuit 100, the mode control and power conversion circuit 106 converts the DC string voltage 120 to a regulated operating voltage 502 in the first mode. The mode control and power conversion circuit 106 provides the regulated operating voltage 502 to the DC power lines 110, 112 in the first mode. The standby voltage 124 is less than the regulated operating voltage 502. The mode control and power conversion circuit 106 stops providing the regulated operating voltage 502 to the DC power lines 110, 112 in the second mode.

With continued reference to FIG. 5, in another example of the controller circuit 100, the mode control and power conversion circuit 106 includes a regulator circuit (e.g., LDO regulator) 304 and a switching device (S1) 306. The regulator circuit 304 receives the DC string voltage 120 and converts the DC string voltage 120 to the standby voltage 124. The switching device 306 receives the standby voltage 124 from the regulator circuit 304 at an input terminal 308, receives the second signal 118 from the receiver circuit 104 at a control terminal 310, and provides the standby voltage 124 to the DC power lines 110,112 via an output terminal 312 in response to the second signal 118 being changed to the second state. The switching device 306 decouples the standby voltage 124 from the output terminal 312 in response to the second signal 118 being set to the first state.

Figure 7:
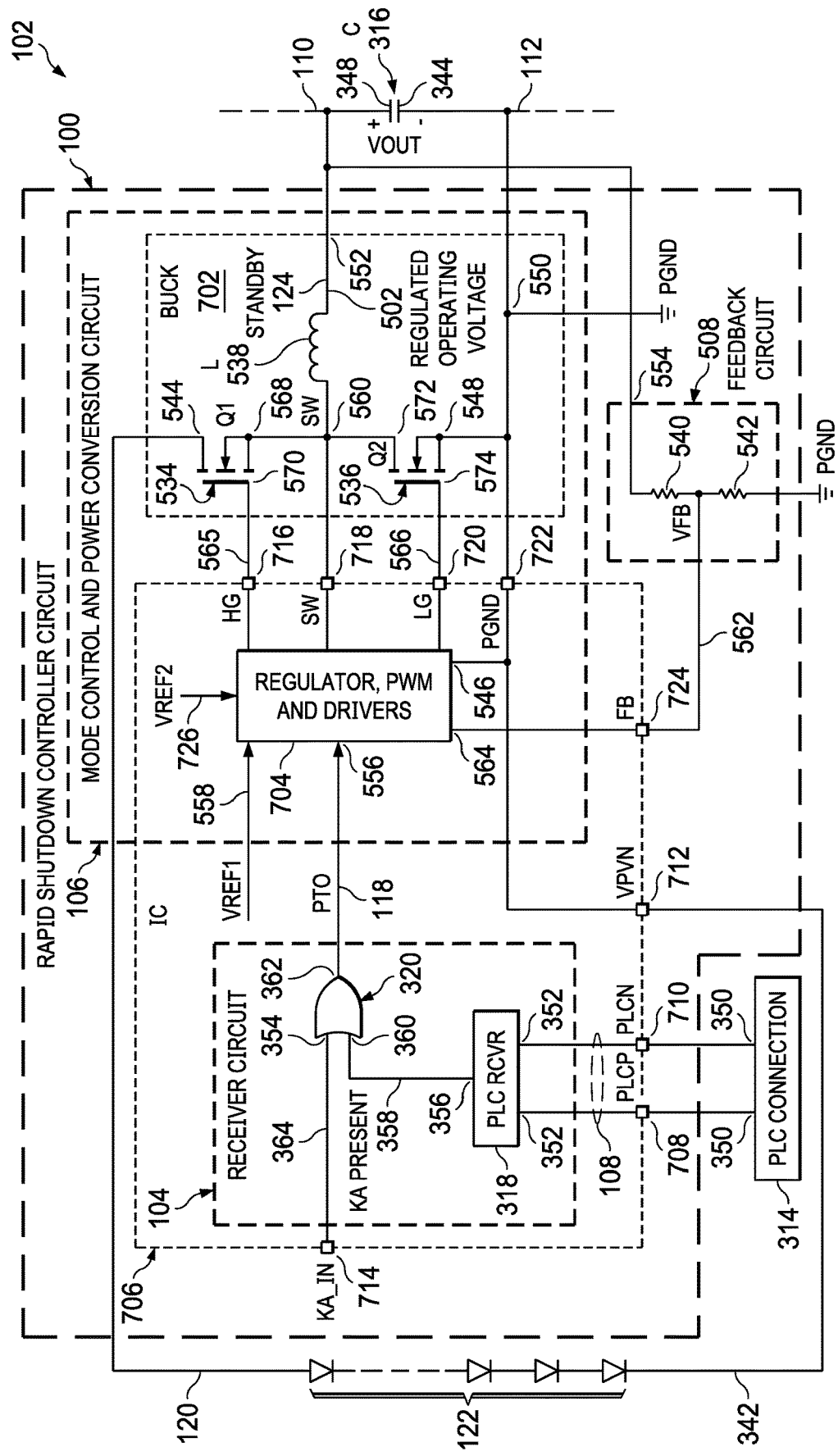
FIG. 7 is a block diagram of another example of a controller circuit for a PV module.

With reference to FIG. 7, in another example of the controller circuit 100, the mode control and power conversion circuit 106 converts the DC string voltage 120 to a regulated operating voltage 502 in the first mode. The mode control and power conversion circuit 106 provides the regulated operating voltage 502 to the DC power lines 110, 112 in the first mode. The standby voltage 124 is less than the regulated operating voltage 502. The mode control and power conversion circuit 106 stops providing the regulated operating voltage 502 to the DC power lines 110, 112 in the second mode.

With continued reference to FIG. 7, in a further example of the controller circuit 100, the mode control and power conversion circuit 106 includes a switching converter circuit 702 and a converter controller circuit 704. The switching converter circuit 702 receives the DC string voltage 120 and converts the DC string voltage 120 to the regulated operating voltage 502 in the first mode and to the standby voltage 124 in the second mode. The converter controller circuit 704 receives the second signal 118 from the receiver circuit 104 and controls the switching converter circuit 702 by switching the switching converter circuit 702 from the first mode to the second mode in response to the second signal 118 being changed to the second state. The converter controller circuit 704 switches the switching converter circuit 702 to the first mode in response to the second signal 118 being set to the first state.

With reference again to FIG. 3, an example of a PV module 102 includes a controller circuit 100, a string of PV cells 122, a PLC connection 314, and a capacitor (C) 316. The controller circuit 100 includes a receiver circuit 104 and a mode control and power conversion circuit 106. The receiver circuit 104 includes a PLC receiver 318 and an OR gate 320. The mode control and power conversion circuit 106 includes a regulator circuit (e.g., LDO regulator) 304, a first switching device (S1) 306, and a second switching device (S2) 322.

In one example, the PLC receiver 318, OR gate 320, regulator circuit 304, and first switching device 306 are packaged in an IC 324. The IC 324 includes a PLC positive (PLCP) pin 326, a PLC negative (PLCN) pin 328, a voltage PV positive (VPVP) pin 330, a voltage PV negative (VPVN) pin 332, a keep alive input (KA_IN) pin 334, a keep alive output (KA_OUT) pin 336, and a voltage output (VOUT) pin 338.

The string of PV cells 122 provides a DC string voltage 120 to the regulator circuit 304 via the VPVP pin 330 and to an input terminal 340 of the second switching device 322. The DC string voltage 120 is also referred to as an operating voltage 302. A DC return path 342 from the string of PV cells 122 is connected to the VPVN pin 332 of the IC 324, a negative terminal 344 of the capacitor 316, and the DC power line return 112. The DC power line 110 is connected to an output terminal 346 of the second switching device 322, an output terminal 312 of the first switching device 306 via the VOUT pin 338 of the IC 324, and a positive terminal 348 of the capacitor 316.

Although not shown, input terminals of the PLC connection 314 are connected to the DC power lines 110, 112. Output terminals 350 of the PLC connection 314 are connected to input terminals 352 of the PLC receiver 318 via the PLCP and PLCN pins 326, 328. In this example, the KA_IN pin 334 is connected to a first input terminal 354 of the OR gate 320 and does not receive a signal from an external component. An output terminal 356 of the PLC receiver 318 provides a KA PRESENT signal 358 to a second input terminal 360 of the OR gate 320. The regulator circuit 304 provides a standby voltage 124 to an input terminal 308 of the first switching device 306. In another example of the controller circuit 100, the PLC signal on the DC power lines 110, 112 is a shutdown signal instead of a KA signal and the output terminal 356 of the PLC receiver 318 is a SHUTDOWN ABSENT signal instead of the KA PRESENT signal 358.

With continued reference to FIG. 3, during a first mode of operation, a transmitter circuit 116 (see, e.g., FIG. 1) repeatedly transmits a first signal 108 via the DC power lines 110, 112. The PLC connection 314 acts as an RLC filter 126 (see, e.g., FIG. 1) to filter the DC power lines 110, 112 and provide the first signal 108 to the PLC receiver 318 via the PLCP and PLCN pins 326, 328. The PLC receiver 318 sets the KA PRESENT signal 358 to a first state based on a presence of the first signal 108 and changes the KA PRESENT signal 358 to a second state based on an absence of the first signal 108. The first state of the KA PRESENT signal 358, for example, is an activation state, an ON state, a logic 1 state, or any suitable state representative of enabling normal operation of the controller circuit 100. The second state of the KA PRESENT signal 358, for example, is a de-activation state, an OFF state, a logic 0 state, or any suitable state representative of disabling normal operation of the controller circuit 100. In another example of the PV module 102, the first signal 108 is a wireless communication signal and the receiver circuit 104 includes a wireless receiver to receive the first signal 108 from the transmitter circuit 116 (see, e.g., FIG. 1). In yet another example of the PV module 102, the first signal 108 is a wired control line communication signal and the receiver circuit 104 includes an input node to receive the first signal 108 from the transmitter circuit 116 (see, e.g., FIG. 1).

In this example, an output terminal 362 of the OR gate 320 (e.g., the second signal 118) simply follows the first and second states of the first signal 108 because there is no connection to the first input terminal 354 of the OR gate. In other words, the second signal 118 is set to a first state based on the presence of the first signal 108 and changed to the second state based on an absence of the first signal 108. In an alternative example, the OR gate 320 receives an alternative first signal 364 at the first input terminal 354 via the KA_IN pin 334 and there are no connections to the PLCP and PLCN pins 326, 328. For example, the alternative first signal 364 is provided by another second signal (not shown) from another controller circuit (not shown) associated with the PV module 102. See FIG. 2 and the corresponding paragraphs referring thereto for additional information on the operation of multiple controller circuits in a PV module with multiple PV sub-modules. In any regard, the second signal 118 is provided from the output terminal 362 of the OR gate to the control terminal 310 of the first switching device 306 and, via the KA_OUT pin 336, to the control terminal 366 of the second switching device 322.

In the first mode, setting the second signal 118 to the first state activates the first and second switching devices 306, 322. Activation of the first switching device 306 decouples the standby voltage 124 from VOUT pin 338 and the DC power line 110. Activation of the second switching device 322 connects the operating voltage 302 to the DC power line 110.

In the second mode, changing the second signal 118 to the second state de-activates the first and second switching devices 306, 322. De-activation of the first switching device 306 couples the standby voltage 124 to the DC power line 110 via the VOUT pin 338. De-activation of the second switching device 322 decouples the operating voltage 302 from the DC power line 110.

In another example of the controller circuit 100, the first switching device 306 includes a field effect transistor (FET), multiple FETs, any suitable switching device(s), or any switching device(s) in combination with other component(s) that form a suitable switching device. In another example of the controller circuit 100, the second switching device 322 includes an FET, multiple FETs, any suitable switching device(s), or any switching device(s) in combination with other component(s) that form a suitable switching device. In another example of the controller circuit 100, the regulator circuit 304 includes an LDO regulator, any suitable voltage regulator, or any suitable voltage regulator in combination with other component(s) that form a suitable regulator circuit.

In another example of the controller circuit 100, the IC 324 includes the second switching device 322. In another example, the IC 324 includes the PLC connection 314. In another example, the IC 324 includes the capacitor 316.

Figure 4:
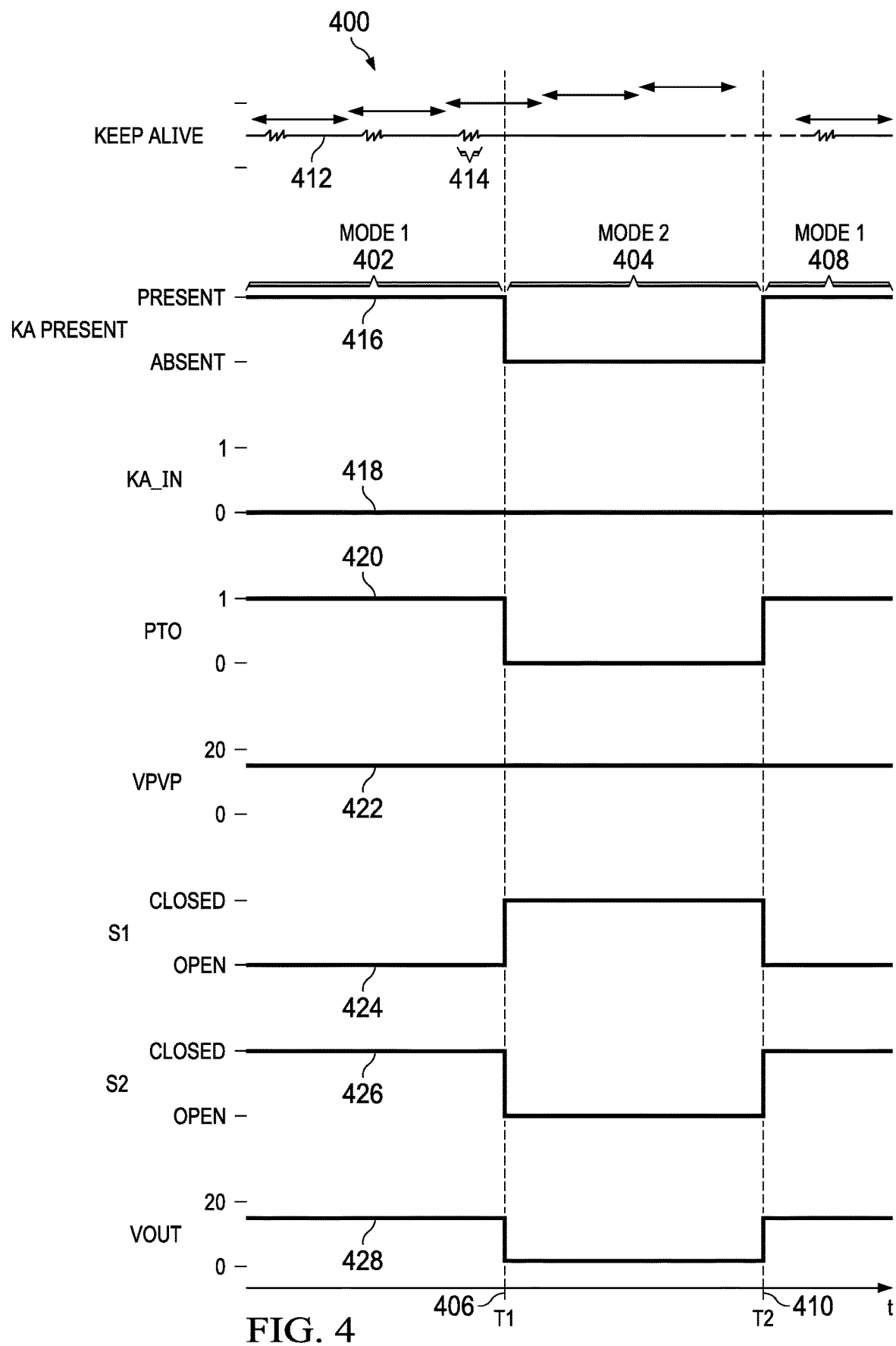
FIG. 4 is a timing diagram that shows an example of the timing of select signals shown in FIG. 3.

With reference to FIG. 4, a timing diagram 400, shows an example of the timing of select signals shown in FIG. 3 in relation to operation of a PV module 102 (see, e.g., FIG. 3) in a first mode (mode 1) 402, transition to a second mode (mode 2) 404 at time T1 406, and return to the first mode (mode 1) 408 at time T2 410.

A plotted KA signal 412 is representative of the first signal 108 (see, e.g., FIG. 3) provided by the PLC connection 314 to the PLC receiver 318 via the PLCP and PLCN pins 326, 328. The multiple variations 414 on the plotted KA signal 412 are representative of the repetitive nature of the first signal 108 during the first mode 402, 408. Between T1 406 and T2 410, the variations 414 on the plotted KA signal 412 are no longer present. This is representative of conditions after the transmitter circuit 116 (see, e.g., FIG. 1) stops transmitting the first signal 108 via the DC power lines 110, 112. For example, this condition occurs after an initiation device 1702 (see FIG. 17) triggers operation of the PV module 102 (see, e.g., FIG. 3) in the second mode 404.

In another example, the first signal 108 is a shutdown signal instead of a KA signal. In this alternate example, the controller circuit 100 of FIG. 3 switches to the second mode in response to receiving a shutdown signal (e.g., instead of after detecting absence of the KA signal). The shutdown signal is not shown in the timing diagram 400 of FIG. 4. For example, the shutdown signal would occur at T1 406 and trigger the transition from the first mode (mode 1) 402 to the second mode (mode 2) 404. Another signal (e.g., KA signal or any suitable startup or enable signal) would occur at T2 410 to trigger the transition from the second mode (mode 2) 404 to the first mode (mode 1) 408.

A plotted KA PRESENT signal 416 is representative of the KA PRESENT signal 358 (see, e.g., FIG. 3) provided by the PLC receiver 318 to the OR gate 320. During the first mode 402, 408, the plotted KA PRESENT signal 416 is set to the first state based on the presence of the first signal 108. During the second mode 404, the plotted KA PRESENT signal 416 is changed to the second state based on the absence of the first signal 108. In another example, the KA PRESENT signal 108 is a SHUTDOWN ABSENT signal (not shown) that would be absent (e.g., high) during the first mode (mode 1) 402, 408 and present (e.g., low) during the second mode (mode 2) 406.

A plotted KA_IN signal 418 is representative of the alternative first signal 364 (see, e.g., FIG. 3) at the KA_IN pin 334 of the IC 324. In the IC 324 of FIG. 3, the KA_IN pin 334 is not connected. Thus, the alternative first signal 363 is at a constant state (e.g., logic 0) during the first mode 402, 408 and the second mode 404.

A plotted PTO signal 420 is representative of the second signal 118 (see, e.g., FIG. 3) provided by the OR gate 320 to the first and second switching devices 306, 322. During the first mode 402, 408, the second signal 118 is set to the first state (e.g., logic 1) based on the KA PRESENT signal 358 being set to the first state. During the second mode 404, the second signal 118 is changed to the second state (e.g., logic 0) based on the KA PRESENT signal 358 being changed to the second state.

A plotted voltage PV positive (VPVP) signal 422 is representative of the DC string voltage 120 (see, e.g., FIG. 3) provided to the VPVP pin 330 of the IC 324 by the string of PV cells 122. The DC string voltage 120 is also referred to as the operating voltage 302. The plotted VPVP signal 422 of FIG. 4 reflects a nominal steady state condition with normal lighting conditions. In one example, the DC string voltage 120 varies over time based on changing lighting conditions. The plotted VPVP signal 422 shows that the transitions from the first mode 402 to the second mode 404 and back to the first mode 408 do not impact the DC string voltage 120.

A plotted first switching device (S1) state 424 is representative of a switching state of the first switching device 306 (e.g., input terminal 308 to output terminal 312) (see, e.g., FIG. 3). During the first mode 402, 408, the switching state is open based on the activation of the first switching device 306 due to the second signal 118 being set to the first state. During the second mode 404, the switching state is closed based on the de-activation of the first switching device 306 due to the second signal 118 being changed to the second state.

A plotted second switching device (S2) state 426 is representative of a switching state of the second switching device 322 (e.g., input terminal 340 to output terminal 346) (see, e.g., FIG. 3). During the first mode 402, 408, the switching state is closed based on the activation of the second switching device 322 due to the second signal 118 being set to the first state. During the second mode 404, the switching state is open based on the de-activation of the second switching device 322 due to the second signal 118 being changed to the second state.

A plotted voltage output (VOUT) signal 428 is representative of the voltage at the VOUT pin 338 (see, e.g., FIG. 3) of the IC 324. The VOUT pin 338 is connected to the DC power line 110, the output terminal 346 of the second switching device 322, and the output terminal 312 of the first switching device 306. During the first mode 402, 408, the second switching device 322 provides the operating voltage 302 to the DC power line 110 and the first switching device 306 decouples the standby voltage 124 from the VOUT pin 338. Under these circumstances, the voltage at the VOUT pin 338 during the first mode 402, 408 is the operating voltage 302. During the second mode 404, the first switching device 306 provides the standby voltage 124 to the VOUT pin 338 and the second switching device 322 decouples the operating voltage 302 from the DC power line 110. Under these circumstances, the standby voltage 124 is provided to the DC power line 110 during the second mode 404.

With reference again to FIG. 5, another example of a PV module 102 includes a controller circuit 100, a string of PV cells 122, a PLC connection 314, and a capacitor (C) 316. The controller circuit 100 includes a receiver circuit 104 and a mode control and power conversion circuit 106. The receiver circuit 104 includes a PLC receiver 318 and an OR gate 320. The mode control and power conversion circuit 106 includes a regulator circuit (e.g., LDO regulator) 304, a first switching device (S1) 306, a switching converter circuit 504, a converter controller circuit 506, and a feedback circuit 508.

In one example, the PLC receiver 318, OR gate 320, regulator circuit 304, first switching device 306, and converter controller circuit 506 are packaged in an IC 510. The IC 510 includes a PLC positive (PLCP) pin 512, a PLC negative (PLCN) pin 514, a voltage PV positive (VPVP) pin 516, a voltage PV negative (VPVN) pin 518, a keep alive input (KA_IN) pin 520, a voltage output (VOUT) pin 522, a high-gate (HG) pin 524, a switching node (SW) pin 526, a low-gate (LG) pin 528, a DC power ground (PGND) pin 530, and a feedback (FB) pin 532.

In the PV module 102 of FIG. 5, the switching converter circuit 504 includes an HG FET (Q1) 534, an LG FET (Q2) 536, and an inductor (L) 538. This type of switching converter circuit 504 is also known as a buck converter. In other examples, the switching converter circuit 504 includes a boost converter, a buck-boost converter, a Cuk converter, or any suitable switching converter circuit.

The feedback circuit 508 includes first and second resistors 540, 542 that form a voltage divider network. In other examples, the feedback circuit 508 includes any combination of components suitable for providing a feedback signal from the switching converter circuit 504 to the converter controller circuit 506.

The string of PV cells 122 provides a DC string voltage 120 to the regulator circuit 304 via the VPVP pin 516 and to a drain terminal 544 of the HG FET 534. A DC return path 342 from the string of PV cells 122 is connected to the VPVN pin 518 of the IC 510, a ground terminal 546 of the converter controller circuit 506, the PGND pin 530 of the IC 510, a source terminal 548 of the LG FET 536, a PGND node 550 of the switching converter circuit 504, a negative terminal 344 of the capacitor 316, and the DC power line return 112.

The DC power line 110 is connected to an output terminal 312 of the first switching device 306 via the VOUT pin 522 of the IC 510, an output node 552 of the switching converter circuit 504, an input terminal 554 of the feedback circuit 508, and a positive terminal 348 of the capacitor 316. Although not shown, input terminals of the PLC connection 314 are connected to the DC power lines 110, 112. Output terminals 350 of the PLC connection 314 are connected to input terminals 352 of the PLC receiver 318 via the PLCP and PLCN pins 512, 514. In this example, the KA_IN pin 520 is connected to a first input terminal 354 of the OR gate 320 and does not receive a signal from an external component. An output terminal 356 of the PLC receiver 318 provides a KA PRESENT signal 358 to a second input terminal 360 of the OR gate 320. The regulator circuit 304 provides a standby voltage 124 to an input terminal 308 of the first switching device 306. In another example of the controller circuit 100, the PLC signal on the DC power lines 110, 112 is a shutdown signal instead of a KA signal and the output terminal 356 of the PLC receiver 318 is a SHUTDOWN ABSENT signal instead of the KA PRESENT signal 358.

During a first mode of operation, a transmitter circuit 116 (see, e.g., FIG. 1) repeatedly transmits a first signal 108 via the DC power lines 110, 112. With continued reference to FIG. 5, the PLC connection 314 acts as an RLC filter 126 (see, e.g., FIG. 1) to filter the DC power lines 110, 112 and provide the first signal 108 to the PLC receiver 318 via the PLCP and PLCN pins 512, 514. The PLC receiver 318 sets the KA PRESENT signal 358 to a first state based on a presence of the first signal 108 and changes the KA PRESENT signal 358 to a second state based on an absence of the first signal 108. The first state of the KA PRESENT signal 358, for example, is an activation state, an ON state, a logic 1 state, or any suitable state representative of enabling normal operation of the controller circuit 100. The second state of the KA PRESENT signal 358, for example, is a de-activation state, an OFF state, a logic 0 state, or any suitable state representative of disabling normal operation of the controller circuit 100. In another example of the PV module 102, the first signal 108 is a wireless communication signal and the receiver circuit 104 includes a wireless receiver to receive the first signal 108 from the transmitter circuit 116 (see, e.g., FIG. 1). In yet another example of the PV module 102, the first signal 108 is a wired control line communication signal and the receiver circuit 104 includes an input node to receive the first signal 108 from the transmitter circuit 116 (see, e.g., FIG. 1).

In this example, an output terminal 362 of the OR gate 320 (e.g., the second signal 118) simply follows the first and second states of the first signal 108 because there is no connection to the first input terminal 354 of the OR gate. In other words, the second signal 118 is set to a first state based on the presence of the first signal 108 and changed to the second state based on an absence of the first signal 108. In an alternative example, the OR gate 320 receives an alternative first signal 364 at the first input terminal 354 via the KA_IN pin 520 and there are no connections to the PLCP and PLCN pins 512, 514. For example, the alternative first signal 364 is provided by another second signal (not shown) from another controller circuit (not shown) associated with the PV module 102. See FIG. 2 and the corresponding paragraphs referring thereto for additional information on the operation of multiple controller circuits in a PV module with multiple PV sub-modules. In any regard, the second signal 118 is provided from the output terminal 362 of the OR gate to the control terminal 310 of the first switching device 306 and to a mode select terminal 556 of the converter controller circuit 506.

In the first mode, setting the second signal 118 to the first state activates the first switching device 306 and selects operation of the converter controller circuit 506 based on a first reference voltage (VREF1) 558 associated with the regulated operating voltage 502. Activation of the first switching device 306 decouples the standby voltage 124 from VOUT pin 522 and the DC power line 110. Operation of the converter controller circuit 506 based on VREF1 558 causes the switching converter circuit 504 to provide the regulated output voltage 502 via the output node 552 to the DC power line 110.

In the second mode, changing the second signal 118 to the second state de-activates the first switching device 306 and de-selects operation of the converter controller circuit 506. De-activation of the first switching device 306 couples the standby voltage 124 to the DC power line 110 via the VOUT pin 522. De-selecting operation of the converter controller circuit 506 causes the switching converter circuit to stop providing the regulated operating voltage 302 to the DC power line 110.

With further reference FIG. 5, the switching converter circuit 504 is controlled by the converter controlling circuit 506 in the first mode based on VREF1 558. The HG FET 534 is coupled between the DC string voltage 120 and an SW node 560 of the switching converter circuit 504. The LG FET 536 is coupled between the SW node 560 and the DC power line return 112. The first and second resistors 540, 542 of the feedback circuit 508 are connected in series with one another between the output node 552 of the switching converter circuit 504 and ground to provide a feedback signal 562 to a feedback terminal 564 of the converter controller circuit 506 via the FB pin 532 of the IC 510. The inductor 538 is coupled between the output node 552 and the switching node 560. The converter controller circuit 506 provides pulse width modulated switching control signals (e.g., HG and LG signals 565, 566) to selectively activate and de-activate the HG FET 534 and LG FET 536 in complementary fashion to control the regulated operating voltage 502 at the output node 552. The converting controller circuit 506 varying the pulse width of the HG and LG signals 565, 566 based on the feedback signal 562 and VREF1 558.

In another example of the controller circuit 100, the first switching device 306 includes an FET, multiple FETs, any suitable switching device(s), or any switching device(s) in combination with other component(s) that form a suitable switching device. In another example of the controller circuit 100, the second switching device 322 includes an FET, multiple FETs, any suitable switching device(s), or any switching device(s) in combination with other component(s) that form a suitable switching device. In another example of the controller circuit 100, the regulator circuit 304 includes an LDO regulator, any suitable voltage regulator, or any suitable voltage regulator in combination with other component(s) that form a suitable regulator circuit.

In another example of controller circuit 100, the IC 510 includes the switching converter circuit 504. In another example, the IC 510 includes the PLC connection 314. In another example, the IC 510 includes the capacitor 316.

Figure 6:
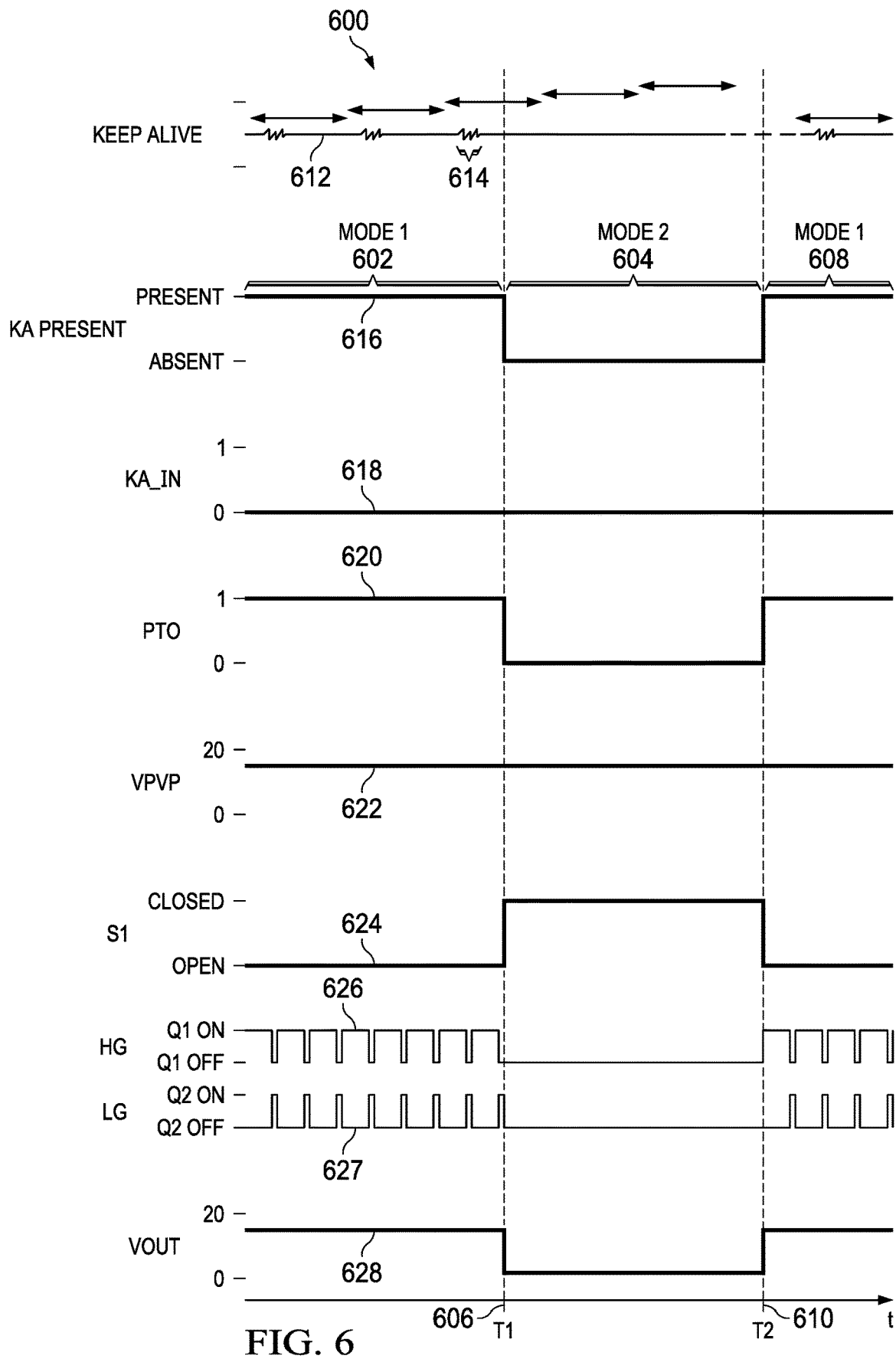
FIG. 6 is a timing diagram that shows an example of the timing of select signals shown in FIG. 5.

With reference to FIG. 6, a timing diagram 600, shows an example of the timing of select signals shown in FIG. 5 in relation to operation of a PV module 102 (see, e.g., FIG. 5) in a first mode (mode 1) 602, transition to a second mode (mode 2) 604 at time T1 606, and return to the first mode (mode 1) 608 at time T2 610.

A plotted KA signal 612 is representative of the first signal 108 (see, e.g., FIG. 5) provided by the PLC connection 314 to the PLC receiver 318 via the PLCP and PLCN pins 512, 514. The multiple variations 614 on the plotted KA signal 612 are representative of the repetitive nature of the first signal 108 during the first mode 602, 608. Between T1 606 and T2 610, the variations 614 on the plotted KA signal 612 are no longer present. This is representative of conditions after the transmitter circuit 116 (see, e.g., FIG. 1) stops transmitting the first signal 108 via the DC power lines 110, 112. For example, this condition occurs after an initiation device 1702 (see FIG. 17) triggers operation of the PV module 102 (see, e.g., FIG. 5) in the second mode 604.

In another example, the first signal 108 is a shutdown signal instead of a KA signal. In this alternate example, the controller circuit 100 of FIG. 5 switches to the second mode in response to receiving a shutdown signal (e.g., instead of after detecting absence of the KA signal). The shutdown signal is not shown in the timing diagram 600 of FIG. 6. For example, the shutdown signal would occur at T1 606 and trigger the transition from the first mode (mode 1) 602 to the second mode (mode 2) 604. Another signal (e.g., KA signal or any suitable startup or enable signal) would occur at T2 610 to trigger the transition from the second mode (mode 2) 604 to the first mode (mode 1) 608.

A plotted KA PRESENT signal 616 is representative of the KA PRESENT signal 358 (see, e.g., FIG. 5) provided by the PLC receiver 318 to the OR gate 320. During the first mode 602, 608, the plotted KA PRESENT signal 616 is set to the first state based on the presence of the first signal 108. During the second mode 604, the plotted KA PRESENT signal 616 is changed to the second state based on the absence of the first signal 108. In another example, the KA PRESENT signal 108 is a SHUTDOWN ABSENT signal (not shown) that would be absent (e.g., high) during the first mode (mode 1) 602, 608 and present (e.g., low) during the second mode (mode 2) 604.

A plotted KA_IN signal 618 is representative of the alternative first signal 364 (see, e.g., FIG. 5) at the KA_IN pin 520 of the IC 510. In the IC 510 of FIG. 5, the KA_IN pin 520 is not connected. Thus, the alternative first signal 363 is at a constant state (e.g., logic 0) during the first mode 602, 608 and the second mode 604.

A plotted PTO signal 620 is representative of the second signal 118 (see, e.g., FIG. 5) provided by the OR gate 320 to the first switching device 306 and the converter controller circuit 506. During the first mode 602, 608, the second signal 118 is set to the first state (e.g., logic 1) based on the KA PRESENT signal 358 being set to the first state. During the second mode 604, the second signal 118 is changed to the second state (e.g., logic 0) based on the KA PRESENT signal 358 being changed to the second state.

A plotted voltage PV positive (VPVP) signal 622 is representative of the DC string voltage 120 (see, e.g., FIG. 5) provided to the VPVP pin 516 of the IC 510 by the string of PV cells 122. The DC string voltage 120 is also provided to the drain terminal 544 of the HG FET 534 in the switching converter circuit 504. The plotted VPVP signal 622 of FIG. 6 reflects a nominal steady state condition with normal lighting conditions. In one example, the DC string voltage 120 varies over time based on changing lighting conditions. The plotted VPVP signal 422 shows that the transitions from the first mode 602 to the second mode 604 and back to the first mode 608 do not impact the DC string voltage 120.

A plotted first switching device (S1) state 624 is representative of a switching state of the first switching device 306 (e.g., input terminal 308 to output terminal 312) (see, e.g., FIG. 5). During the first mode 602, 608, the switching state is open based on the activation of the first switching device 606 due to the second signal 118 being set to the first state. During the second mode 604, the switching state is closed based on the de-activation of the first switching device 306 due to the second signal 118 being changed to the second state.

A plotted HG FET (Q1) state 626 is representative of switching states of the HG FET 534 (e.g., drain terminal 544 to source terminal 568) (see, e.g., FIG. 5). During the first mode 602, 608, the switching state switches between "on" and "off" states based on the pulse width modulated switching control signal (e.g., HG signal 565) applied to the gate terminal 570 of the HG FET 534 by the converter controller circuit 506 due to the second signal 118 being set to the first state. During the second mode 604, the switching state remains off based on the de-activation of the HG FET 534 by the converter controller circuit 506 due to the second signal 118 being changed to the second state.

A plotted LG FET (Q2) state 627 is representative of switching states of the LG FET 536 (e.g., drain terminal 572 to source terminal 548) (see, e.g., FIG. 5). During the first mode 602, 608, the switching state switches between "off" and "on" states based on the pulse width modulated switching control signal (e.g., LG signal 566) applied to the gate terminal 574 of the LG FET 536 by the converter controller circuit 506 due to the second signal 118 being set to the first state. During the second mode 604, the switching state remains off based on the de-activation of the LG FET 536 by the converter controller circuit 506 due to the second signal 118 being changed to the second state.

A plotted voltage output (VOUT) signal 628 is representative of the voltage at the output node 552 (see, e.g., FIG. 5) of the switching converter circuit 504. The output node 552 is connected to the DC power line 110. During the first mode 602, 608, the switching converter circuit 504 provides the regulated operating voltage 502 to the DC power line 110 via the output node 552 and the first switching device 306 decouples the standby voltage 124 from the VOUT pin 522. Under these circumstances, the voltage at the VOUT pin 522 during the first mode 602, 608 is the regulated operating voltage 502. During the second mode 604, the first switching device 306 provides the standby voltage 124 to the VOUT pin 522 and the switching converter circuit 504 decouples the regulated operating voltage 502 from the DC power line 110. Under these circumstances, the standby voltage 124 is provided to the DC power line 110 during the second mode 604.

With reference again to FIG. 7, another example of a PV module 102 includes a controller circuit 100, a string of PV cells 122, a PLC connection 314, and a capacitor (C) 316. The controller circuit 100 includes a receiver circuit 104 and a mode control and power conversion circuit 106. The receiver circuit 104 includes a PLC receiver 318 and an OR gate 320. The mode control and power conversion circuit 106 includes a switching converter circuit 702, a converter controller circuit 704, and a feedback circuit 508.

In one example, the PLC receiver 318, OR gate 320, and converter controller circuit 704 are packaged in an IC 706. The IC 706 includes a PLC positive (PLCP) pin 708, a PLC negative (PLCN) pin 710, a voltage PV negative (VPVN) pin 712, a keep alive input (KA_IN) pin 714, a high-gate (HG) pin 716, a switching node (SW) pin 718, a low-gate (LG) pin 720, a DC power ground (PGND) pin 722, and a feedback (FB) pin 724.

In the PV module 102 of FIG. 7, the switching converter circuit 702 includes an HG FET (Q1) 534, an LG FET (Q2) 536, and an inductor (L) 538. This type of switching converter circuit 702 is also known as a buck converter. In other examples, the switching converter circuit 702 includes a boost converter, a buck-boost converter, a Cuk converter, or any suitable switching converter circuit.

The feedback circuit 508 includes first and second resistors 540, 542 that form a voltage divider network. In other examples, the feedback circuit 508 includes any combination of components suitable for providing a feedback signal from the switching converter circuit 702 to the converter controller circuit 704.

The string of PV cells 122 provides a DC string voltage 120 to a drain terminal 544 of the HG FET 534. A DC return path 342 from the string of PV cells 122 is connected to the VPVN pin 712 of the IC 706, a ground terminal 546 of the converter controller circuit 704, the PGND pin 722 of the IC 706, a source terminal 548 of the LG FET 536, a PGND node 550 of the switching converter circuit 702, a negative terminal 344 of the capacitor 316, and the DC power line return 112.

The DC power line 110 is connected to an output node 552 of the switching converter circuit 702, an input terminal 554 of the feedback circuit 508, and a positive terminal 348 of the capacitor 316. Although not shown, input terminals of the PLC connection 314 are connected to the DC power lines 110, 112. Output terminals 350 of the PLC connection 314 are connected to input terminals 352 of the PLC receiver 318 via the PLCP and PLCN pins 708, 710. In this example, the KA_IN pin 714 is connected to a first input terminal 354 of the OR gate 320 and does not receive a signal from an external component. An output terminal 356 of the PLC receiver 318 provides a KA PRESENT signal 358 to a second input terminal 360 of the OR gate 320. In another example of the controller circuit 100, the PLC signal on the DC power lines 110, 112 is a shutdown signal instead of a KA signal and the output terminal 356 of the PLC receiver 318 is a SHUTDOWN ABSENT signal instead of the KA PRESENT signal 358.

During a first mode of operation, a transmitter circuit 116 (see, e.g., FIG. 1) repeatedly transmits a first signal 108 via the DC power lines 110, 112. With continued reference to FIG. 7, the PLC connection 314 acts as an RLC filter 126 (see, e.g., FIG. 1) to filter the DC power lines 110, 112 and provide the first signal 108 to the PLC receiver 318 via the PLCP and PLCN pins 708, 710. The PLC receiver 318 sets the KA PRESENT signal 358 to a first state based on a presence of the first signal 108 and changes the KA PRESENT signal 358 to a second state based on an absence of the first signal 108. The first state of the KA PRESENT signal 358, for example, is an activation state, an ON state, a logic 1 state, or any suitable state representative of enabling normal operation of the controller circuit 100. The second state of the KA PRESENT signal 358, for example, is a de-activation state, an OFF state, a logic 0 state, or any suitable state representative of disabling normal operation of the controller circuit 100. In another example of the PV module 102, the first signal 108 is a wireless communication signal and the receiver circuit 104 includes a wireless receiver to receive the first signal 108 from the transmitter circuit 116 (see, e.g., FIG. 1). In yet another example of the PV module 102, the first signal 108 is a wired control line communication signal and the receiver circuit 104 includes an input node to receive the first signal 108 from the transmitter circuit 116 (see, e.g., FIG. 1).

In this example, an output terminal 362 of the OR gate 320 (e.g., the second signal 118) simply follows the first and second states of the first signal 108 because there is no connection to the first input terminal 354 of the OR gate. In other words, the second signal 118 is set to a first state based on the presence of the first signal 108 and changed to the second state based on an absence of the first signal 108. In an alternative example, the OR gate 320 receives an alternative first signal 364 at the first input terminal 354 via the KA_IN pin 714 and there are no connections to the PLCP and PLCN pins 708, 710. For example, the alternative first signal 364 is provided by another second signal (not shown) from another controller circuit (not shown) associated with the PV module 102. See FIG. 2 and the corresponding paragraphs referring thereto for additional information on the operation of multiple controller circuits in a PV module with multiple PV sub-modules. In any regard, the second signal 118 is provided from the output terminal 362 of the OR gate to a mode select terminal 556 of the converter controller circuit 704.

In the first mode, setting the second signal 118 to the first state selects operation of the converter controller circuit 704 based on a first reference voltage (VREF1) 558 associated with the regulated operating voltage 502. Operation of the converter controller circuit 704 based on VREF1 558 causes the switching converter circuit 702 to provide the regulated output voltage 502 via the output node 552 to the DC power line 110. Operation of the converter controller circuit 704 based on VREF1 558 also causes the switching converter circuit 702 to stop providing the standby voltage 124 to the output node 552.

In the second mode, changing the second signal 118 to the second state selects operation of the converter controller circuit 704 based on a second reference voltage (VREF2) 726 associated with the standby voltage 124. Operation of the converter controller circuit 704 based on VREF2 726 causes the switching converter circuit 702 to provide the standby voltage 124 via the output node 552 to the DC power line 110. Operation of the converter controller circuit 704 based on VREF2 726 also causes the switching converter circuit 702 to stop providing the regulated operating voltage 502 to the output node 552.

With further reference FIG. 7, the switching converter circuit 702 is controlled by the converter controlling circuit 704 in the first mode based on the VREF1 558. The HG FET 534 is coupled between the DC string voltage 120 and an SW node 560 of the switching converter circuit 702. The LG FET 536 is coupled between the SW node 560 and the DC power line return 112. The first and second resistors 540, 542 of the feedback circuit 508 are connected in series with one another between the output node 552 of the switching converter circuit 702 and ground to provide a feedback signal 562 to a feedback terminal 564 of the converter controller circuit 704 via the FB pin 724 of the IC 706. The inductor 538 is coupled between the output node 552 and the switching node 560. The converter controller circuit 704 provides pulse width modulated switching control signals (e.g., HG and LG signals 565, 566) to selectively activate and de-activate the HG FET 534 and LG FET 536 in complementary fashion to control the regulated operating voltage 502 at the output node 552. The converting controller circuit 704 varying the pulse width of the HG and LG signals 565, 566 based on the feedback signal 562 and VREF1 558.

In this example, the switching converter circuit 702 is also controlled by the converter controlling circuit 704 in the second mode. However, in the second mode, the control is based on VREF2 726. The converter controller circuit 704 provides the pulse width modulated switching control signals (e.g., HG and LG signals 565, 566) to selectively activate and de-activate the HG FET 534 and LG FET 536 in complementary fashion to control the standby voltage 124 at the output node 552. The converting controller circuit 704 varying the pulse width of the HG and LG signals 565, 566 based on the feedback signal 562 and VREF2 726.

In another example controller circuit 100, the IC 706 includes the switching converter circuit 702. In another example, the IC 706 includes the PLC connection 314. In another example, the IC 706 includes the capacitor 316.

Figure 8:
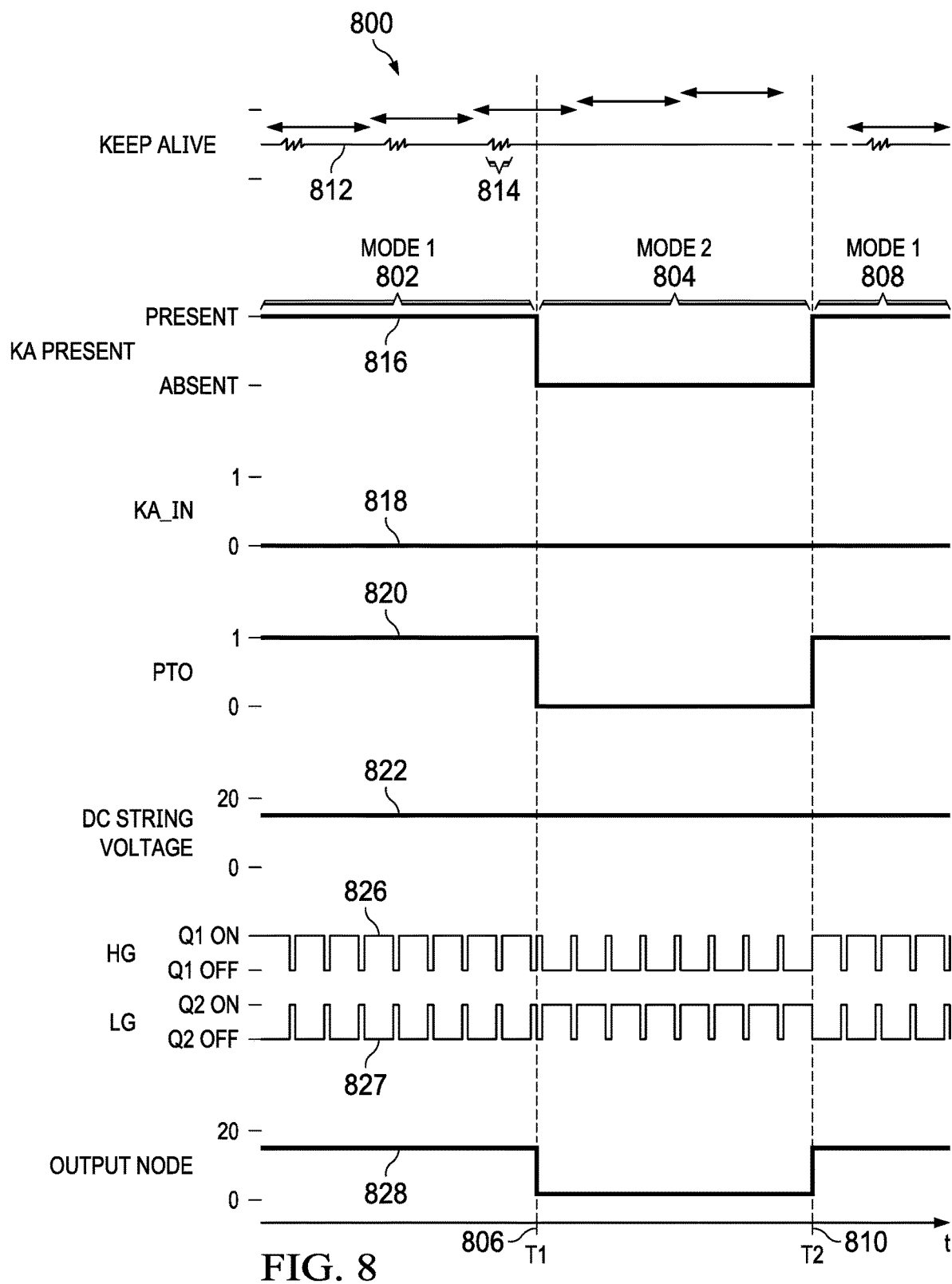
FIG. 8 is a timing diagram that shows an example of the timing of select signals shown in FIG. 7.

With reference to FIG. 8, a timing diagram 800, shows an example of the timing of select signals shown in FIG. 7 in relation to operation of a PV module 102 (see, e.g., FIG. 7) in a first mode (mode 1) 802, transition to a second mode (mode 2) 804 at time T1 806, and return to the first mode (mode 1) 808 at time T2 810.

A plotted KA signal 812 is representative of the first signal 108 (see, e.g., FIG. 7) provided by the PLC connection 314 to the PLC receiver 318 via the PLCP and PLCN pins 708, 710. The multiple variations 814 on the plotted KA signal 812 are representative of the repetitive nature of the first signal 108 during the first mode 802, 808. Between T1 806 and T2 810, the variations 814 on the plotted KA signal 812 are no longer present. This is representative of conditions after the transmitter circuit 116 (see, e.g., FIG. 1) stops transmitting the first signal 108 via the DC power lines 110, 112. For example, this condition occurs after an initiation device 1702 (see FIG. 17) triggers operation of the PV module 102 (see, e.g., FIG. 7) in the second mode 804.

In another example, the first signal 108 is a shutdown signal instead of a KA signal. In this alternate example, the controller circuit 100 of FIG. 5 switches to the second mode in response to receiving a shutdown signal (e.g., instead of after detecting absence of the KA signal). The shutdown signal is not shown in the timing diagram 600 of FIG. 6. For example, the shutdown signal would occur at T1 606 and trigger the transition from the first mode (mode 1) 602 to the second mode (mode 2) 604. Another signal (e.g., KA signal or any suitable startup or enable signal) would occur at T2 610 to trigger the transition from the second mode (mode 2) 604 to the first mode (mode 1) 608.

A plotted KA PRESENT signal 816 is representative of the KA PRESENT signal 358 (see, e.g., FIG. 7) provided by the PLC receiver 318 to the OR gate 320. During the first mode 802,808, the plotted KA PRESENT signal 816 is set to the first state based on the presence of the first signal 108. During the second mode 804, the plotted KA PRESENT signal 816 is changed to the second state based on the absence of the first signal 108. In another example, the KA PRESENT signal 108 is a SHUTDOWN ABSENT signal (not shown) that would be absent (e.g., high) during the first mode (mode 1) 602, 608 and present (e.g., low) during the second mode (mode 2) 604.

A plotted KA_IN signal 618 is representative of the alternative first signal 364 (see, e.g., FIG. 7) at the KA_IN pin 714 of the IC 706. In the IC 706 of FIG. 7, the KA_IN pin 714 is not connected. Thus, the alternative first signal 363 is at a constant state (e.g., logic 0) during the first mode 602, 608 and the second mode 604.

A plotted PTO signal 820 is representative of the second signal 118 (see, e.g., FIG. 7) provided by the OR gate 320 to the converter controller circuit 704. During the first mode 802, 808, the second signal 118 is set to the first state (e.g., logic 1) based on the KA PRESENT signal 358 being set to the first state. During the second mode 804, the second signal 118 is changed to the second state (e.g., logic 0) based on the KA PRESENT signal 358 being changed to the second state.

A plotted DC string voltage 822 is representative of the DC string voltage 120 (see, e.g., FIG. 7) provided to the drain terminal 544 of the HG FET 534 in the switching converter circuit 702 by the string of PV cells 122. The plotted DC string voltage 822 of FIG. 8 reflects a nominal steady state condition with normal lighting conditions. In one example, the DC string voltage 120 varies over time based on changing lighting conditions. The plotted DC string voltage 822 shows that the transitions from the first mode 802 to the second mode 804 and back to the first mode 808 do not impact the DC string voltage 120.

A plotted HG FET (Q1) state 826 is representative of switching states of the HG FET 534 (e.g., drain terminal 544 to source terminal 568) (see, e.g., FIG. 7). During the first mode 802, 808, the switching state switches between "on" and "off" states based on the pulse width modulated switching control signal (e.g., HG signal 565) associated with VREF1 558 that is applied to the gate terminal 570 of the HG FET 534 by the converter controller circuit 704 due to the second signal 118 being set to the first state. During the second mode 804, the switching state switches between "on" and "off" states based on the pulse width modulated switching control signal (e.g., HG signal 565) associated with VREF2 726 that is applied to the gate terminal 570 of the HG FET 534 by the converter controller circuit 704 due to the second signal 118 being changed to the second state.

A plotted LG FET (Q2) state 827 is representative of switching states of the LG FET 536 (e.g., drain terminal 572 to source terminal 548) (see, e.g., FIG. 7). During the first mode 802, 808, the switching state switches between "off" and "on" states based on the pulse width modulated switching control signal (e.g., LG signal 566) associated with VREF1 558 that is applied to the gate terminal 574 of the LG FET 536 by the converter controller circuit 704 due to the second signal 118 being set to the first state. During the second mode 804, the switching state switches between "on" and "off" states based on the pulse width modulated switching control signal (e.g., LG signal 566) associated with VREF2 726 that is applied to the gate terminal 574 of the LG FET 536 by the converter controller circuit 704 due to the second signal 118 being changed to the second state.

A plotted output node signal 828 is representative of the voltage at the output node 552 (see, e.g., FIG. 7) of the switching converter circuit 702. The output node 552 is connected to the DC power line 110. During the first mode 802, 808, the switching converter circuit 702 provides the regulated operating voltage 502 to the DC power line 110 via the output node 552 and stops providing the standby voltage 124 to the output node 552. Under these circumstances, the voltage at the output node 552 during the first mode 802, 808 is the regulated operating voltage 502. During the second mode 804, the switching converter circuit 702 provides the standby voltage 124 to the DC power line 110 via the output node 552 and the switching converter circuit 702 stops providing the regulated operating voltage 502 to the output node 552. Under these circumstances, the standby voltage 124 is provided to the DC power line 110 during the second mode 804.

Figure 9:
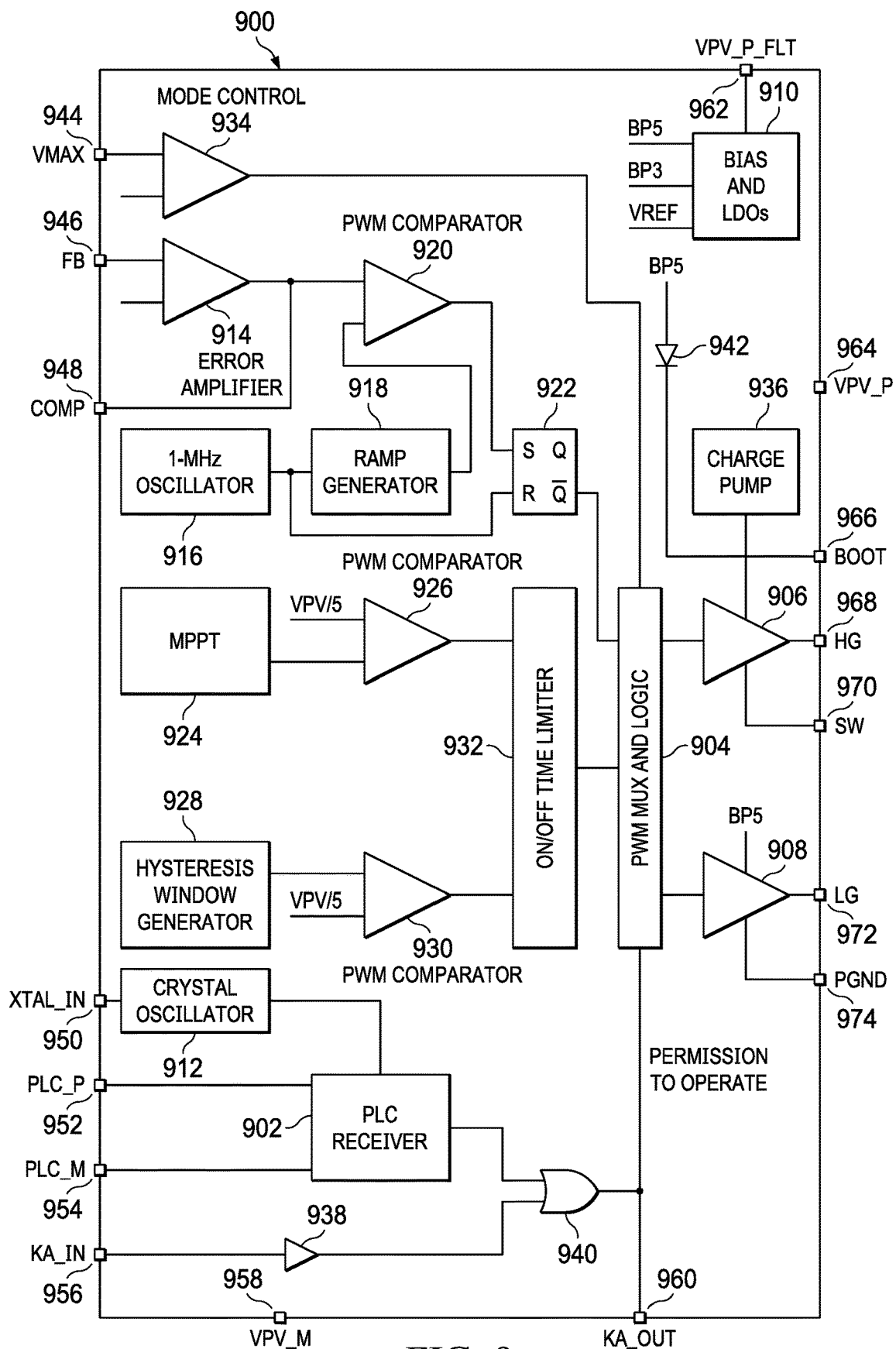
FIG. 9 is a block diagram of an example of an integrated circuit (IC) that facilitates rapid shutdown of a PV module.

With reference to FIG. 9, an example of an IC 900 that facilitates rapid shutdown of a PV module (102 (see, e.g., FIG. 1). In this example, the IC 900 includes a PLC receiver 902, a PWM mux and logic circuit 904, a high-side driver 906, a low-side driver 908, and bias and LDO circuits 910. The IC 900 also includes a crystal oscillator 912 to support operation of the PLC receiver 902. The IC 900 includes an error amplifier 914, a 1-MHz oscillator 916, a ramp generator 918, a first PWM comparator 920, an SR flip-flop 922, an MPPT circuit 924, a second PWM comparator 926, a hysteresis window generator circuit 928, a third PWM comparator 930, an on/off time limiter circuit 932, a mode control 934, and a charge pump 936 to support operation of the PWM mux and logic circuit 904. The IC 900 also includes a buffer 938, an OR gate 940, and a diode 942. The IC 900 includes a VMAX pin 944, an FB pin 946, a COMP pin 948, an XTAL_IN pin 950, a PLC_P pin 952, a PLC_M pin 954, a KA_IN pin 956, a VPV_M pin 958, a KA_OUT pin 960, a VPV_P_FLT pin 962, a VPV_P pin 964, a Boot pin 966, an HG pin 968, an SW pin 970, an LG pin 972, and a PGND pin 974.

The VMAX pin 944 is an input pin that connects to an input of the mode control 934. The FB pin 946 is an input pin that connect to an input of the error amplifier 914. The COMP pin 948 is an output pin that connects to an output of the error amplifier 914. The XTAL_IN pin 950 is an input pin that connects to an input of the crystal oscillator 912. The PLC_P and PLC_M pins 952, 954 are input pins that connect to inputs of the PLC receiver 902. The KA_IN pin 956 is an input pin that connects to an input of the buffer 938. The VPV_M and VPV_P pins 958, 964 are input pins that provide source nodes for negative and positive PV connections. The KA_OUT pin 960 is an output pin that connects to an output of the OR gate 940. The VPV_P_FLT pin 962 in an input pin that provides a filtered source node for positive PV connections. The Boot pin 966 is an input pin that supplies power to the high-side gate driver 906. The HG pin 968 is an output pin that connects to an output of the high-side gate driver 906. The SW pin 970 is an output pin that connects to the high-side gate driver 906 and provides a switching node for a buck converter. The LG pin 972 is an output pin that connects to an output of the low-side gate driver 908. The PGND pin 974 is an input pin that supplies ground to the low-side gate driver 908.

The IC 900 operates as a power conversion controller that adds functionality to a PV module junction box. In other words, the IC 900 is part of a remotely operated buck controller circuit card assembly in the PV module junction box. The circuit card assembly replaces traditional bypass diodes in PV modules deployed in rooftop PV arrays. Remote control is achieved via the on-board PLC receiver 902. The PLC protocol is compliant with the standard developed through the SunSpec Alliance. The control algorithms for the IC 900 are compliant with the NEC 690.12 requirements for rapid shutdown. In normal operation, the IC 900 increases energy harvest under any sunlight and load condition.

When the PLC receiver 902 determines the KA signal is not present, the IC 900 couples a 0.33 v standby voltage to the DC power line and decouples a regulated operating voltage. Even when stacked several times, the standby voltage provides a safe NEC-compliant shutdown voltage to aid PV installers in larger rooftop systems where multiple PV strings are routed through a common conduit.

When the PLC receiver 902 determines the KA signal is present, the IC 900 increases buck output power with the constraint that the output voltage does not exceed a user-defined voltage set by the VMAX pin 944. The maximum power tracking performance is sufficiently fast enough to not interfere with MPPT operation of conventional power inverters connected to the DC power lines downstream from the PV module.

When string current, ISTR, is below module maximum power current, the IC 900 regulates the buck output voltage to a level, VMAX, defined by an external resistor divider. As ISTR increases, the DC string voltage (e.g., VPV_P 964 to VPV_M 958) falls and the IC 900 increases the buck duty cycle to maintain the VMAX output voltage, reaching D=1 when ISTR reaches the level where the DC string voltage drops to VMAX. During this mode of operation, the buck converter operates with a fixed frequency, voltage mode control loop to regulate the output voltage, consisting of the error amplifier 914, ramp generator 918, and first PWM comparator 920. The error amplifier 914 is compensated externally via the COMP pin 948.

When ISTR exceeds the maximum power current, IMP, the control algorithms for the IC 900 reduce the buck duty cycle to increase output power harvest, regulating VMP and IMP at the DC string voltage (buck input). The IC 900 continually searches for maximum power harvest, tracking changes in sunlight or load current conditions. During this mode of operation, the buck converter operates with a fixed frequency, window hysteretic control loop to regulate the DC string voltage to the regulated operating voltage.

The IC 900 has an integrated boot regulator and requires a small ceramic capacitor between the BOOT pin 966 and SW pin 970 to provide the gate drive voltage for the high-side MOSFET of the buck converter. The value of the ceramic capacitor is 0.1 µF. A ceramic capacitor with an X7R or X5R grade dielectric with a voltage rating of 10 V or higher is recommended because of the stable characteristics over temperature and voltage. Further, the onboard integrated charge pump 936 supplements the charge delivered from the switching action and allows the IC 900 to operate at 100% duty cycle.

The voltage reference system produces a precise ±1% voltage reference over temperature by scaling the output of a temperature-stable bandgap circuit. The bandgap and scaling circuits produce 1.20 V at the non-inverting input of the error amplifier 914.

A resistor divider between output node of the buck converter and Vmax and Vmax to the VPV_M pin 958 sets the value at which the output voltage of the buck convertor is limited. The voltage at Vmax is compared to the onboard voltage reference 1.20 v. If Vmax is above this threshold, the converter operates in output limiting mode. If Vmax is below this threshold, the converter operates in MPPT mode.

In relation to rapid shutdown and the PLC receiver 902, S-FSK is a modulation and demodulation technique combining some of the advantages of a classical spread spectrum system, i.e., immunity against narrowband interferences with the advantages of a classical FSK system, low complexity, and previous spread spectrum implementations.

The transmitter assigns the space frequency fS to "data 0" and the mark frequency fM to "data 1". The difference between S-FSK and the classical FSK lies in the fact that fS and fM are placed far from each other (spreading) to improve transmission quality. Each frequency has its own attenuation factor and local narrow-band noise spectrum.

The PLC receiver 902 performs FSK demodulation at the two possible frequencies (the half-channels) resulting in two demodulated digital signals dS and dM. If the average reception quality of the two half-channels is similar, a decision unit in the PLC receiver 902 decides on the higher of the two demodulated channels (data 0 if ds>dm; data 1 if ds<dm). If, however, the average reception quality of one half-channel is better than the quality of the other half-channel, the decision unit compares the demodulated signal of the better channel with a threshold T, thus ignoring the worse channel.

In relation to the PLC protocol, the "keep-alive" signal comprises a 15-bit packet that is repeated about 10 times per second. The tone representing each bit in the sequence is transmitted for about 5 milliseconds. When SNR is limited by white additive noise, the 15-bit sequence increases the SNR. Three consecutive 15-bit Keep-Alive sequences are combined in the detector of the PLC receiver 902 to obtain additional SNR.

The IC 900 is stacked to accommodate PV modules of various sizes (e.g., PV modules with multiple sub-modules). It is not necessary to couple the PLC signal to each IC associated with the PV module. Instead, the KA_IN and KA_OUT pins 956, 960 is used to daisy chain ICs such that a string of PV sub-modules within a PV module is turned on or off simultaneously.

The PWM mux and logic circuit 904 responds to a PTO signal from the PLC receiver 902 or from the KA_IN pin 956 in conjunction with the OR gate 940. Likewise, the voltage on the KA_OUT pin 960 follows the state of either the PLC receiver 902 or the KA_IN pin 956 in conjunction with the OR gate 940.

The IC 900 has an integrated UVLO circuit that monitors the voltage on the VPV_P pin 964. When the VPV_P pin 964 is below 5 v relative to the VPV_M pin 958, the power stage is high Z and the IC 900 does not convert power. When the VPV_P pin 964 crosses 8 volts, power conversion commences.

Figure 10:
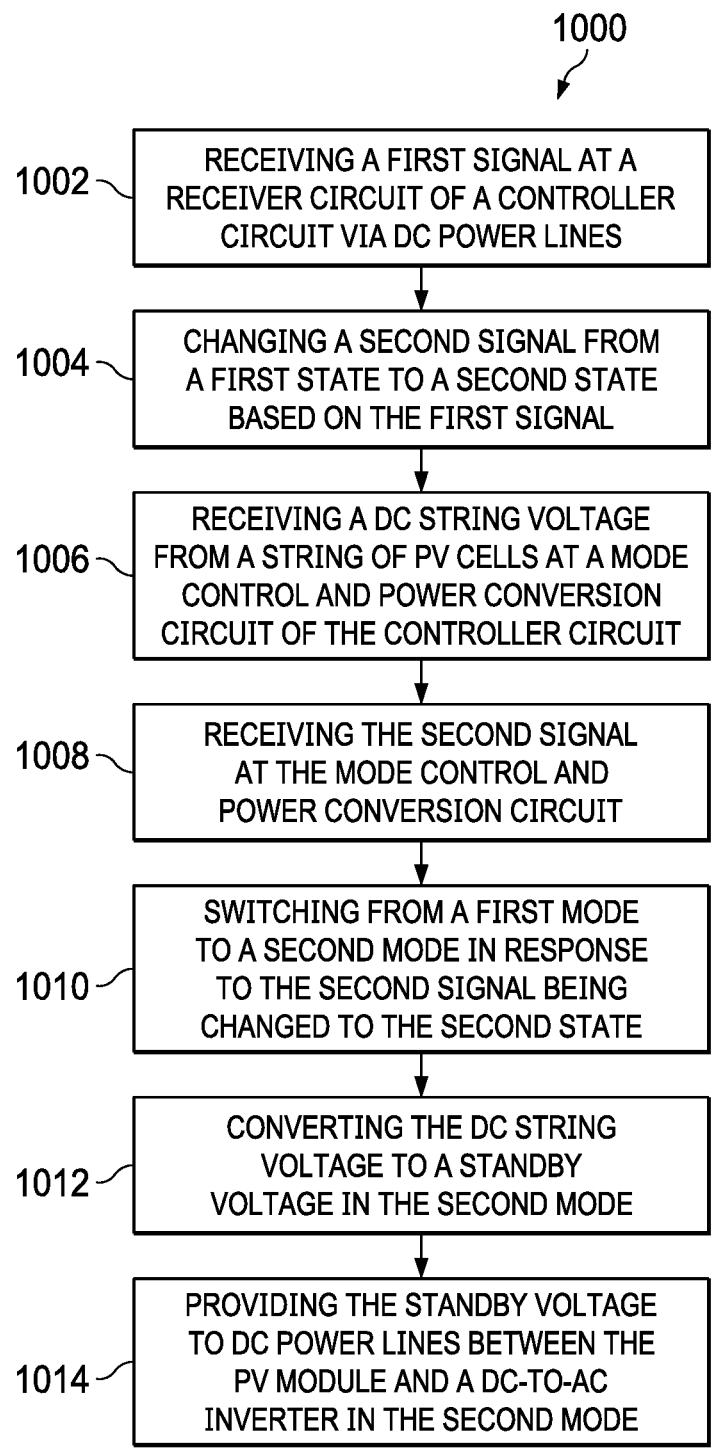
FIG. 10 is a flow chart of an example of a method for rapid shutdown of a PV module.

With reference to FIG. 10, an example of a method 1000 for rapid shutdown of a PV module 102 (see, e.g., FIG. 1) is disclosed. In several examples, the controller circuit 100 described in FIGS. 1-9 implements the method 1000. In FIG. 10, the method 1000 begins at 1002 where a receiver circuit 104 (see, e.g., FIG. 1) of a controller circuit 100 for the PV module 102 receives a first signal 108 from a transmitter circuit 116 associated with the PV module 102. At 1004 of FIG. 10, the receiver circuit 104 (see, e.g., FIG. 1) changes a second signal 118 from a first state to a second state based on the first signal 108. At 1006, a mode control and power conversion circuit 106 of the controller circuit 100 (see, e.g., FIG. 1) receives a DC string voltage 120 from a string of PV cells 122 associated with the PV module 102. At 1008, the mode control and power conversion circuit 106 (see, e.g., FIG. 1) receives the second signal 118 from the receiver circuit 104. At 1010, the mode control and power conversion circuit 106 (see, e.g., FIG. 1) switches from a first mode to a second mode in response to the second signal 118 being changed to the second state. At 1012, the mode control and power conversion circuit 106 (see, e.g., FIG. 1) converts the DC string voltage 120 to a standby voltage 124 in the second mode. At 1014, the mode control and power conversion circuit 106 (see, e.g., FIG. 1) provides the standby voltage 124 to DC power lines 110, 112 between the PV module 102 and a DC-to-AC inverter 114 in the second mode.

In another example of method 1000, the first signal 108 is a PLC signal. In this example, the receiver circuit 104 receives the PLC signal via the DC power lines 110, 112 between the PV module 102 and the DC-to-AC inverter 114. In a further example of the method 1000, the transmitter circuit 116 transmits the first signal 108 over the DC power lines 110, 112 in an S-FSK waveform that is in compliance with the PLC protocol requirements of SunSpec Interoperability Specification, Communication Signal for Rapid Shutdown, Version 34. In another example of the controller circuit 100, the first signal 108 is a wireless communication signal. In another example of the controller circuit 100, the first signal 108 is a wired control line communication signal. In another example of the method 1000, the second signal 118 is a digital signal with digital logic levels that represent activation of the first mode in the first state and de-activation of the first mode in the second state.

Figure 11:
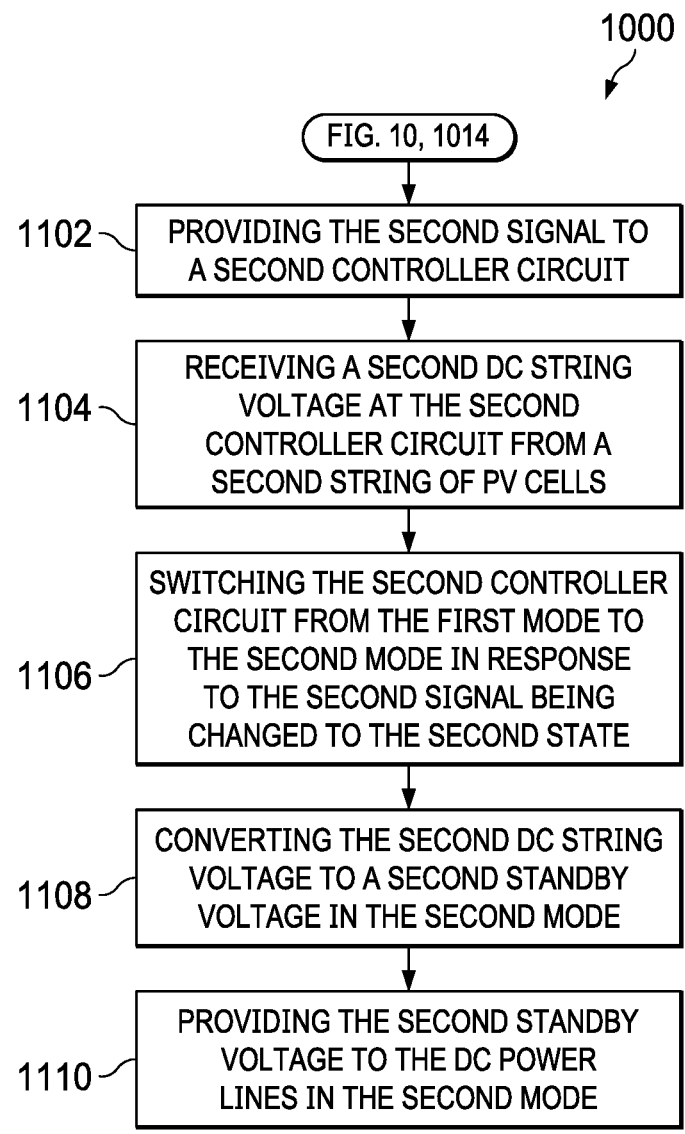
FIG. 11, in combination with FIG. 10, is a flow chart of another example of a method for rapid shutdown of a PV module.

With reference to FIGS. 10 and 11, another example of the method 1000 continues from 1014 to 1102. In this example, the controller circuit 100 (see, e.g., FIG. 2) receives the DC string voltage from a first PV sub-module 206 of the PV module 204. The first PV sub-module 206 including the string of PV cells 122. The mode control and power conversion circuit 106 receives the DC string voltage 120 from the first PV sub-module 206. At 1102 of FIG. 11, the receiver circuit 104 (see, e.g., FIG. 2) provides the second signal 118 to a second controller circuit 202. At 1104 of FIG. 11, the second controller circuit 202 (see, e.g., FIG. 2) receives a second DC string voltage 214 from a second string of PV cells 216 associated with a second PV sub-module 208 of the PV module 204. At 1106 of FIG. 11, the second controller circuit 202 (see, e.g., FIG. 2) switches from the first mode to the second mode in response to the second signal 118 being changed to the second state. At 1108 of FIG. 11, the second controller circuit 202 (see, e.g., FIG. 2) converts the second DC string voltage 214 to a second standby voltage 218 in the second mode. At 1110 of FIG. 11, the second controller circuit 202 provides the second standby voltage 218 to the DC power lines 110, 112 in the second mode such that the second standby voltage 218 is in series with the standby voltage 124.

Figure 12:
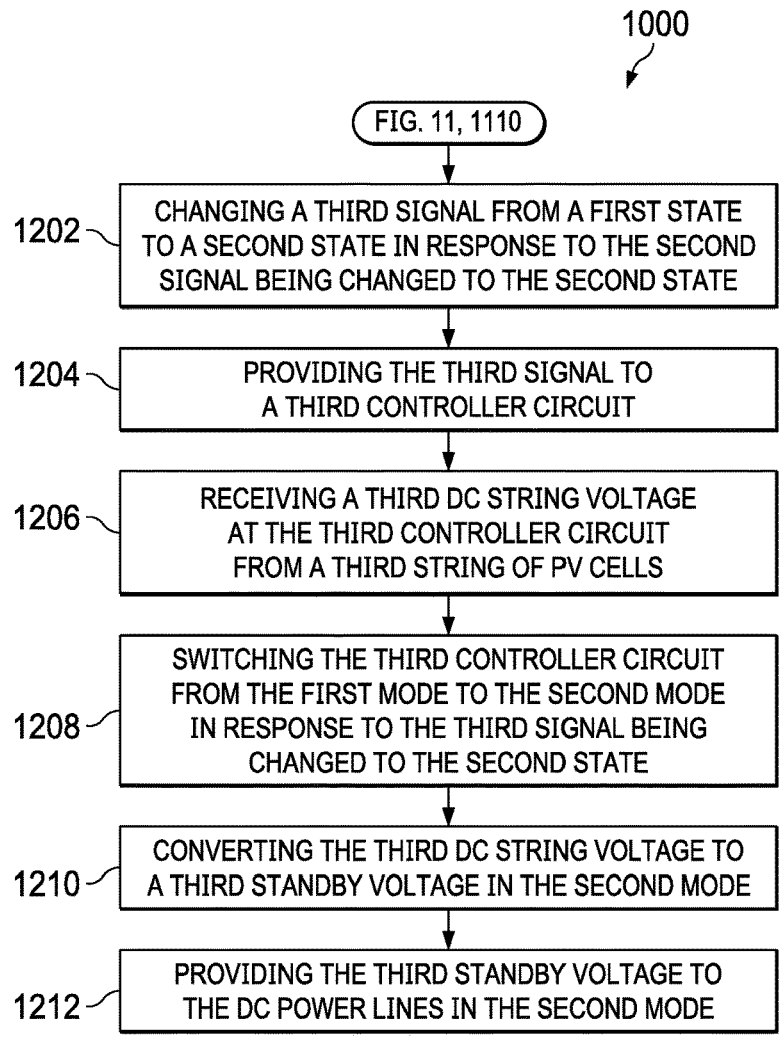
FIG. 12, in combination with FIGS. 10 and 11, is a flow chart of another example of a method for rapid shutdown of a PV module.

With reference to FIGS. 10-12, another example of the method 1000 continues from 1110 to 1202 where the second controller circuit 202 (see, e.g., FIG. 2) changes a third signal 226 from a first state to a second state in response to the second signal 118 being changed to the second state by the receiver circuit 108. At 1204 of FIG. 12, the second controller circuit 202 (see, e.g., FIG. 2) provides the third signal 226 to a third controller circuit 222. At 1206 of FIG. 12, the third controller circuit 222 (see, e.g., FIG. 2) receives a third DC string voltage 232 from a third string of PV cells 234 associated with a third PV sub-module 224 of the PV module 204. At 1208 of FIG. 12, the third controller circuit 222 (see, e.g., FIG. 2) switches from the first mode to the second mode in response to the third signal 226 being changed to the second state. At 1210 of FIG. 12, the third controller circuit 222 (see, e.g., FIG. 2) converts the third DC string voltage 232 to a third standby voltage 236 in the second mode. At 1212 of FIG. 12, the third controller circuit 222 (see, e.g., FIG. 2) provides the third standby voltage 236 to the DC power lines 110, 112 in the second mode such that the third standby voltage 236 is in series with the standby voltage 124 and the second standby voltage 218.

Figure 13:
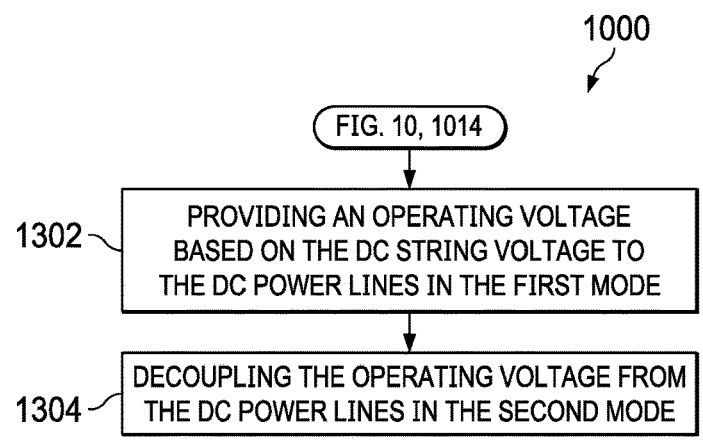
FIG. 13, in combination with FIG. 10, is a flow chart of another example of a method for rapid shutdown of a PV module.

With reference to FIGS. 10 and 13, another example of the method 1000 continues from 1014 to 1302 where the mode control and power conversion circuit 106 (see, e.g., FIG. 3) provides an operating voltage 302 based on the DC string voltage 120 to the DC power lines 110, 112 in the first mode. The standby voltage 124 is less than the operating voltage 302. At 1304 of FIG. 13, the mode control and power conversion circuit 106 (see, e.g., FIG. 3) decouples the operating voltage from the DC power lines in the second mode.

Figure 14:
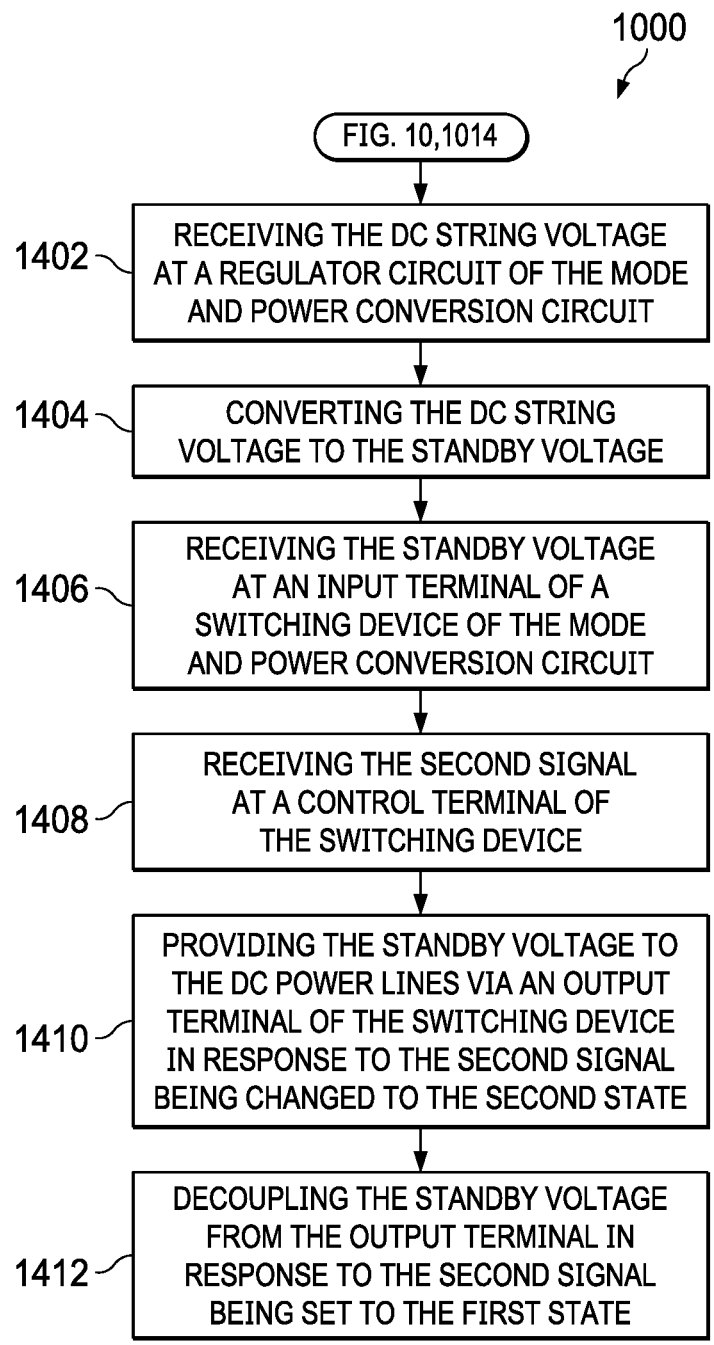
FIG. 14, in combination with FIG. 10, is a flow chart of another example of a method for rapid shutdown of a PV module.

With reference to FIGS. 10 and 14, another example of the method 1000 continues from 1014 to 1402. In this example, the mode control and power conversion circuit 106 (see, e.g., FIG. 3) includes a regulator circuit (e.g., LDO regulator) 304 and a switching device (S1) 306. At 1402 of FIG. 14, the regulator circuit 304 (see, e.g., FIG. 3) receives the DC string voltage 120. At 1404 of FIG. 14, the regulator circuit 304 (see, e.g., FIG. 3) converts the DC string voltage 120 to the standby voltage 124. At 1406 of FIG. 14, the switching device 306 (see, e.g., FIG. 3) receives the standby voltage 124 from the regulator circuit 304 at an input terminal 308. At 1408 of FIG. 14, the switching device 306 (see, e.g., FIG. 3) receives the second signal 118 from the receiver circuit 104 at a control terminal 310. At 1410 of FIG. 14, the switching device (see, e.g., FIG. 3) provides the standby voltage 124 to the DC power lines 110, 112 via an output terminal 312 in response to the second signal 118 being changed to the second state. At 1412 of FIG. 14, the switching device (see, e.g., FIG. 3) decouples the standby voltage 124 from the output terminal 312 in response to the second signal 118 being set to the first state.

Figure 15:
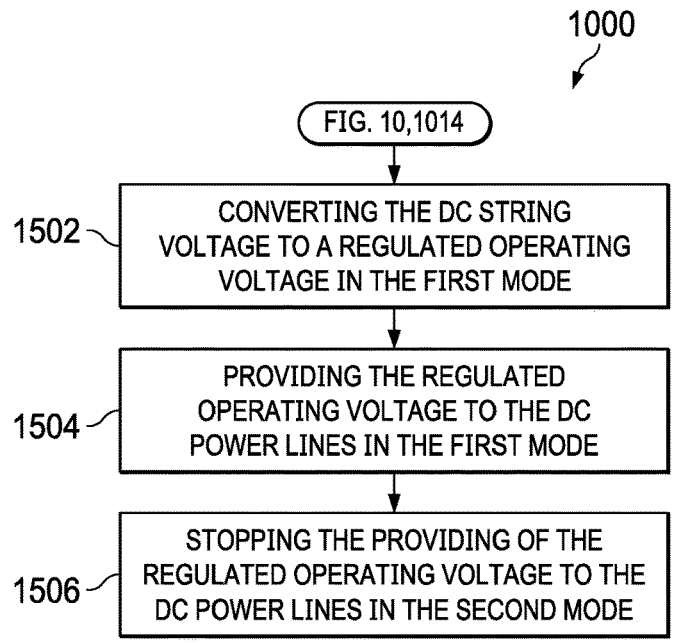
FIG. 15, in combination with FIG. 10, is a flow chart of another example of a method for rapid shutdown of a PV module.

With reference to FIGS. 10 and 15, another example of the method 1000 continues from 1014 to 1502 where the mode control and power conversion circuit 106 (see, e.g., FIG. 7) converts the DC string voltage 120 to a regulated operating voltage 502 in the first mode. The standby voltage 124 is less than the regulated operating voltage 502. At 1504 of FIG. 15, the mode control and power conversion circuit 106 (see, e.g., FIG. 7) provides the regulated operating voltage 502 to the DC power lines 110, 112 in the first mode. At 1506 of FIG. 15, the mode control and power conversion circuit 106 (see, e.g., FIG. 7) stops providing the regulated operating voltage 502 to the DC power lines 110, 112 in the second mode.

Figure 16:
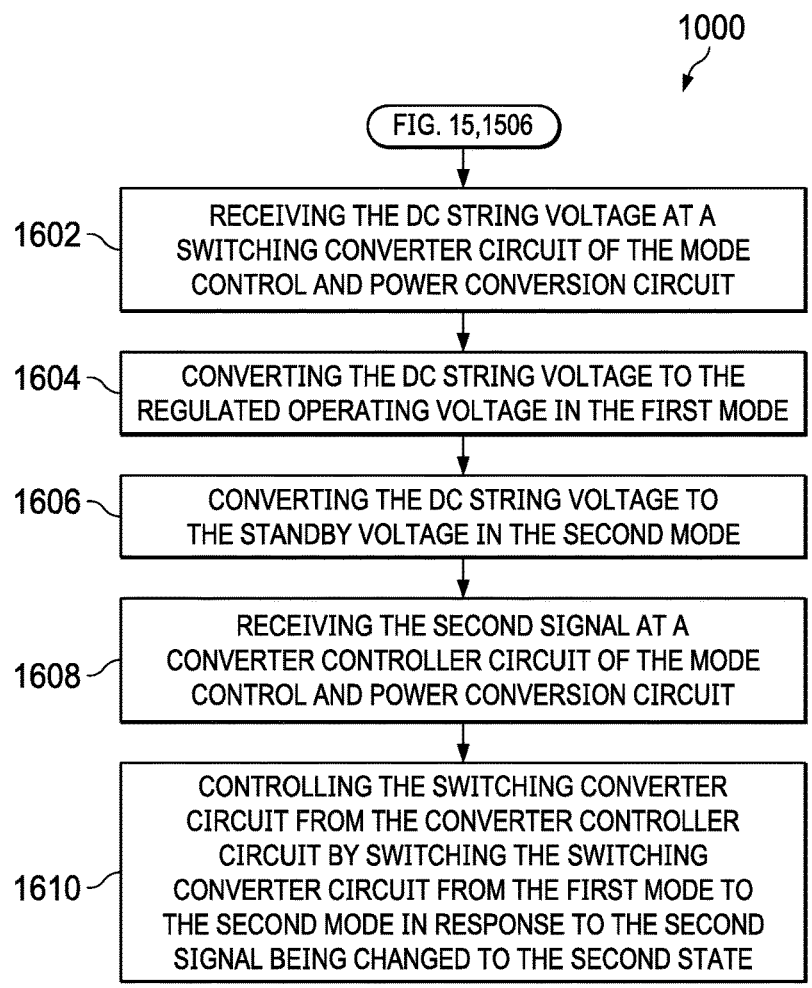
FIG. 16, in combination with FIGS. 10 and 15, is a flow chart of another example of a method for rapid shutdown of a PV module.

With reference to FIGS. 10, 15, and 16, another example of the method 1000 continues from 1506 to 1602. In this example, the mode control and power conversion circuit 106 (see, e.g., FIG. 7) includes a switching converter circuit 702 and a converter controller circuit 704. At 1602 of FIG. 16, the switching converter circuit 702 (see, e.g., FIG. 7) receives the DC string voltage 120. At 1604 of FIG. 16, the switching converter circuit 702 (see, e.g., FIG. 7) converts the DC string voltage 120 to the regulated operating voltage 502 in the first mode. At 1606 of FIG. 16, the switching converter circuit 702 (see, e.g., FIG. 7) converts the DC string voltage 120 to the standby voltage 124 in the second mode. At 1608 of FIG. 16, the converter controller circuit 704 receives the second signal 118 from the receiver circuit 104. At 1610 of FIG. 16, the converter controller circuit 704 (see, e.g., FIG. 7) controls the switching converter circuit 702 by switching the switching converter circuit 702 from the first mode to the second mode in response to the second signal 118 being changed to the second state. The converter controller circuit 704 switches the switching converter circuit 702 to the first mode in response to the second signal 118 being set to the first state.

Figure 17:
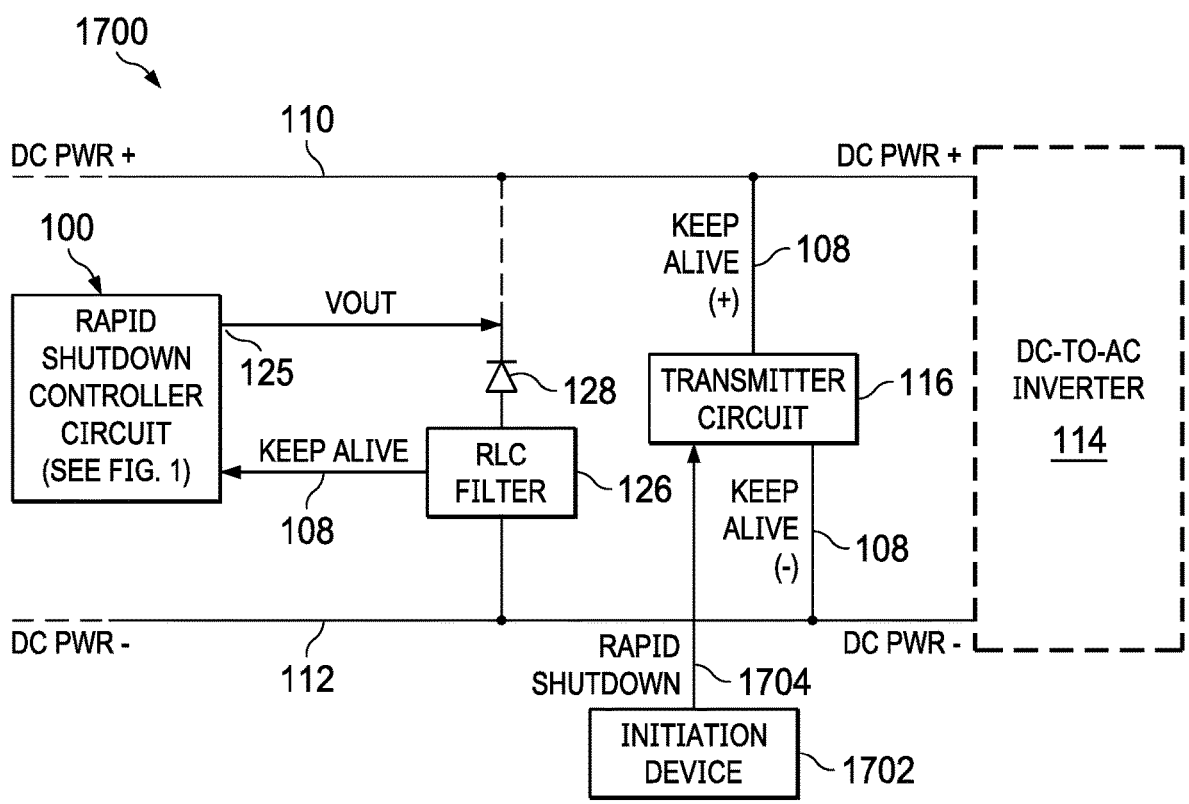
FIG. 17 is a block diagram of an example of a PV rapid shutdown system (PVRSS) for a PV module.

With reference to FIG. 17, an example of a PVRSS 1700 for rapid shutdown of a PV module 102 (see, e.g., FIG. 1) includes an initiation device 1702, a transmitter circuit 116, and a controller circuit 100. For example, FIG. 17 refers to the controller circuit 100 as a rapid shutdown controller circuit. The initiation device 1702 switches between a first condition and a second condition. The first condition sets a fourth signal 1704 to a first state to enable operation of the system in a first mode. For example, FIG. 17 refers to the fourth signal 1704 as a rapid shutdown signal. The second condition of the initiation device 1702 changes the fourth signal 1704 to a second state to trigger operation of the system in a second mode. The first state of the fourth signal 1704, for example, is an activation state, an ON state, a logic 1 state, or any suitable state representative of enabling normal operation of the PVRSS 1700. The second state of the fourth signal 1704, for example, is a de-activation state, an OFF state, a logic 0 state, or any suitable state representative of disabling normal operation of the PVRSS 1700.

The transmitter circuit 116 receives the fourth signal 1704 from the initiation device 1702. The transmitter circuit 116 generates a first signal 108 in response to the fourth signal 1704. For example, FIG. 17 refers to the first signal 108 as a KA signal. The KA signal may be transmitted one or more times within a frame. The frame may be transmitted periodically or asynchronously within a first predetermined time period. In another example, the first signal 108 may be a shutdown signal. The shutdown signal may be transmitted asynchronously in response to a shutdown event. The shutdown signal may be transmitted multiple times to ensure detection.

The controller circuit 100 includes a receiver circuit 104 (see, e.g., FIG. 1) and a mode control and power conversion circuit 106. Various examples of the controller circuit 100 are described above with reference to FIGS. 1-9. In various examples, the controller circuit 100 of the PVRSS 1700 implements various examples of the method for rapid shutdown of a PV module described in FIGS. 10-16.

In one example of the PVRSS 1700, an RLC filter 126 or any suitable filter provides a filtered version of the DC power lines 110, 112 with the first signal 108 to the controller circuit 100. In another example of the PVRSS 1700, the first signal 108 is a wireless communication signal (e.g., WiFi, Zigbee, or any suitable wireless signal) and the controller circuit 100 includes a wireless receiver to receive the first signal 108 from the transmitter circuit 116. In another example of the PVRSS 1700, the first signal 108 is a wired control line communication signal (e.g., wires, cable, bus, or any conductor(s) suitable for wired control signals) and the controller circuit 100 includes an input node to receive the first signal 108 from the transmitter circuit 116. In one example, a Schottky diode 128 or any suitable bypass diode is connected from an output node 125 of the controller circuit 100 to the RLC filter 126 or the DC power line return 112. The Schottky diode 128 passes DC current in a condition in which no voltage is output by the controller circuit 100.

In another example of the PVRSS 1700, the first signal 108 (e.g., KA signal) is repeatedly transmitted by the transmitter circuit 116 to enable normal operation. In one example, presence of the first signal 108 is repeatedly detected by the controller circuit 100 after filtering and demodulating communication signals from the DC power lines 110, 112. For example, if at least one first signal 108 is detected over a second predetermined time period, the controller circuit 100 considers the first signal 108 to be present and operates in a normal mode. Conversely, if no first signal 108 is detected over the second predetermined time period, the controller circuit 100 considers the first signal 108 to be absent and operates in a shutdown mode. The second predetermined time period, for example, being less than or equal to the first predetermined time period associated with the repeated transmission of the first signal 108.

In another example of the PVRSS 1700, the first signal 108 (e.g., shutdown signal) is transmitted at least once by the transmitter circuit 116 to disable normal operation. The controller circuit 100 operates in the normal mode based on an absence of the first signal 108. The controller circuit 100 operates in the shutdown mode based on a presence of the first signal 108. In this example, the controller circuit 100 processes the shutdown signal differently than the KA signal but controls operation in the same manner even though the logic for processing the shutdown and KA signals is different. In other words, the controller circuit 100 operates in the normal mode based on presence of the KA signal and/or absence of the shutdown signal and operates in the shutdown mode based on absence of the KA signal and/or present of the shutdown signal.

In another example of the PVRSS 1700, if at least one first signal 108 is detected, the receiver circuit 104 considers the first signal 108 to be present. In order to ensure detection, the transmitter circuit 116 may re-transmit the first signal 108 multiple times during a first predetermined time. Conversely, if no first signal 108 is detected during a second predetermined time, the receiver circuit 104 considers the first signal 108 to be absent.

In another example of the PVRSS 1700, the first signal 108 is a PLC signal. In this example, the controller circuit 100 receives the PLC signal via the DC power lines 110, 112 between the PV module 102 and the DC-to-AC inverter 114. In a further example of the PVRSS 1700, the transmitter circuit 116 transmits the first signal 108 over the DC power lines 110, 112 in a spread frequency-shift keying (S-FSK) waveform that is in compliance with the PLC protocol requirements of SunSpec Interoperability Specification, Communication Signal for Rapid Shutdown, Version 34. In another example of the controller circuit 100, the first signal 108 is a wireless communication signal. In another example of the controller circuit 100, the first signal 108 is a wired control line communication signal.

Modifications are possible in the described examples, and other examples are possible, within the scope of the claims. The various circuits described above can be implemented using any suitable combination of discrete components, ICs, processors, memory, storage devices, and firmware.

The following is claimed:

1. A controller circuit for a photovoltaic (PV) module, the controller circuit comprising:
    a receiver circuit configured to receive a first signal from a transmitter circuit and to change a second signal from a first state to a second state responsive the first signal; and
    a mode control and power conversion circuit configured to: receive a direct current (DC) voltage from a string of PV cells; receive the second signal from the receiver circuit; and switch from a first mode to a second mode responsive to the second signal being in the second state, wherein in the second mode the mode control and power conversion circuit is configured to convert the DC voltage to a standby voltage and to provide the standby voltage to DC power lines, the standby voltage being less than an operating voltage provided by the mode control and power conversion circuit in the first mode.

2. The controller circuit of claim 1, wherein the PV module includes the controller circuit.

3. The controller circuit of claim 1, wherein the controller circuit is an integrated circuit (IC).

4. The controller circuit of claim 1, wherein the standby voltage is 2.5 volts DC or less.

5. The controller circuit of claim 1, wherein the first signal is repeatedly transmitted to enable normal operation of the PV module, and wherein the receiver circuit is configured to set the second signal to the first state responsive to a presence of the first signal and to change the second signal to the second state responsive to an absence of the first signal.

6. The controller circuit of claim 1, wherein the first signal is transmitted at least once to disable normal operation, and wherein the receiver circuit is configured to set the second signal to the first state responsive to an absence of the first signal and to change the second signal to the second state responsive to a presence of the first signal.

7. The controller circuit of claim 1, wherein the first signal is one of a power line communication (PLC) signal, a wireless communication signal, and a wired control line communication signal.

8. The controller circuit of claim 1, wherein the second signal is a digital signal with digital logic levels representative of activation of the first mode in the first state and de-activation of the first mode in the second state.

9. The controller circuit of claim 1, wherein the controller circuit is configured to receive the DC voltage from a first PV sub-module of the PV module, the first PV sub-module including the string of PV cells, wherein the mode control and power conversion circuit is configured to receive the DC voltage from the first PV sub-module;
    wherein the receiver circuit is configured to provide the second signal to a second controller circuit;
    wherein the second controller circuit is configured to: receive a second DC voltage from a second string of PV cells of a second PV sub-module of the PV module; and switch from the first mode to the second mode responsive to the second signal being in the second state, wherein in the second mode the second controller circuit is configured to convert the second DC voltage to a second standby voltage, and to provide the second standby voltage to the DC power lines such that the second standby voltage is in series with the standby voltage.

10. The controller circuit of claim 9, wherein the second controller circuit is configured to change a third signal from a first state to a second state responsive to the second signal being in the second state and to provide the third signal to a third controller circuit;
    wherein the third controller circuit is configured to: receive a third DC voltage from a third string of PV cells of a third PV sub-module of the PV module; and switch from the first mode to the second mode responsive to the third signal being in the second state, wherein in the second mode the third controller circuit is configured to convert the third DC voltage to a third standby voltage and to provide the third standby voltage to the DC power lines such that the third standby voltage is in series with the standby voltage and the second standby voltage.

11. The controller circuit of claim 1, wherein
    in the second mode the mode control and power conversion circuit is configured to decouple the operating voltage from the DC power lines.

12. The controller circuit of claim 1, the mode control and power conversion circuit comprising:
    a regulator circuit, configured to receive the DC voltage and to convert the DC voltage to the standby voltage; and
    a switching device having an input terminal, a control terminal, and an output terminal, the switching device configured to: receive the standby voltage from the regulator circuit at the input terminal; receive the second signal from the receiver circuit at the control terminal; and provide the standby voltage to the DC power lines via the output terminal responsive to the second signal being in the second state, in which the switching device is configured to decouple the standby voltage from the output terminal responsive to the second signal being in the first state.

13. The controller circuit of claim 1, wherein in the first mode the mode control and power conversion circuit is configured to convert the DC voltage to the operating voltage in the first mode and to provide the operating voltage to the DC power lines;
    wherein the mode control and power conversion circuit is configured to stop providing the operating voltage to the DC power lines in the second mode.

14. A controller circuit for a photovoltaic (PV) module, the controller circuit comprising:
    a receiver circuit configured to receive a first signal from a transmitter circuit and to change a second signal from a first state to a second state responsive the first signal; and
    a mode control and power conversion circuit comprising:
    a switching converter circuit configured to: receive a direct current (DC) voltage from a string of PV cells; to convert the DC voltage to an operating voltage in a first mode; and convert the DC voltage to a standby voltage in a second mode; and a converter controller circuit, configured to: receive the second signal from the receiver circuit; switch the switching converter circuit to the first mode responsive to the second signal being in to the first state; and switch the switching converter circuit from the first mode to the second mode responsive to the second signal being in the second state.

15. A method for rapid shutdown of a photovoltaic (PV) module, the method comprising:
providing an operating voltage by a mode control and power conversion circuit of a controller circuit in a first mode;
receiving a first signal at a receiver circuit of the controller circuit for the PV module, the first signal received from a transmitter circuit;
changing a second signal from a first state to a second state at the receiver circuit, the changing based on the first signal;
receiving a direct current (DC) voltage at the mode control and power conversion circuit, the DC voltage received from a string of PV cells;
receiving the second signal from the receiver circuit at the mode control and power conversion circuit;
switching the mode control and power conversion circuit from the first mode to a second mode responsive to the second signal being in the second state;
converting the DC voltage to a standby voltage at the mode control and power conversion circuit in the second mode, the standby voltage being less than the operating voltage; and
providing, in the second mode, the standby voltage from the mode control and power conversion circuit to DC power lines between the PV module and a DC-to-AC inverter.

16. The method of claim 15, further comprising the controller circuit receiving the DC voltage from a first PV sub-module of the PV module, the first PV sub-module including the string of PV cells, and the mode control and power conversion circuit receiving the DC voltage from the first PV sub-module, and the method further comprising:
providing the second signal from the receiver circuit to a second controller circuit;
receiving a second DC voltage at the second controller circuit from a second string of PV cells of a second PV sub-module of the PV module;
switching the second controller circuit from the first mode to the second mode responsive to the second signal being in the second state;
converting the second DC voltage to a second standby voltage at the second controller circuit in the second mode; and
providing the second standby voltage from the second controller circuit to the DC power lines in the second mode such that the second standby voltage is in series with the standby voltage.

17. The method of claim 16, further comprising:
changing a third signal from a first state to a second state at the second controller circuit responsive to the second signal being in the second state by the receiver circuit;
providing the third signal from the second controller circuit to a third controller circuit;
receiving a third DC voltage at the third controller circuit from a third string of PV cells of a third PV sub-module of the PV module;
switching the third controller circuit from the first mode to the second mode responsive to the third signal being in the second state;
converting the third DC voltage to a third standby voltage at the third controller circuit in the second mode; and
providing the third standby voltage from the third controller circuit to the DC power lines in the second mode such that the third standby voltage is in series with the standby voltage and the second standby voltage.

18. The method of claim 15, further comprising:
providing the operating voltage from the mode control and power conversion circuit to the DC power lines in the first mode; and
decoupling the operating voltage from the DC power lines at the mode control and power conversion circuit in the second mode.

19. The method of claim 15, wherein the mode control and power conversion circuit includes a regulator circuit and a switching device, the method further comprising:
receiving the DC voltage at the regulator circuit;
converting the DC voltage to the standby voltage at the regulator circuit;
receiving the standby voltage from the regulator circuit at an input terminal of the switching device;
receiving the second signal from the receiver circuit at a control terminal of the switching device;
providing the standby voltage to the DC power lines via an output terminal of the switching device in response to the second signal being in the second state; and
decoupling the standby voltage from the output terminal of the switching device in response to the second signal being in the first state.

20. The method of claim 15, further comprising:
providing the regulated operating voltage from the mode control and power conversion circuit to the DC power lines in the first mode; and
stopping the providing of the regulated operating voltage to the DC power lines from the mode control and power conversion circuit in the second mode.

21. A method for rapid shutdown of a photovoltaic (PV) module including a controller circuit, the controller circuit including a receiver circuit and a mode control and power conversion circuit, the mode control and power conversion circuit including a switching converter circuit and a converter controller circuit, the method comprising:
receiving a first signal at the receiver circuit from a transmitter circuit;
changing a second signal from a first state to a second state at the receiver circuit, the changing based on the first signal;
receiving a direct current (DC) voltage at the switching converter circuit;
converting the DC voltage to an operating voltage at the switching converter circuit in a first mode;
converting the DC voltage to a standby voltage at the switching converter circuit in a second mode;
receiving the second signal from the receiver circuit at the converter controller circuit; and
switching the switching converter circuit from the first mode to the second mode responsive to the second signal being in the second state; and
switching the converter circuit to the first mode responsive to the second signal being in the first state.

* * * * *